US011408933B2

(12) United States Patent
Baer et al.

(10) Patent No.: US 11,408,933 B2
(45) Date of Patent: Aug. 9, 2022

(54) MANIPULATOR FOR MOVING A TEST HEAD

(71) Applicant: Reid-Ashman Manufacturing, Inc., St. George, UT (US)

(72) Inventors: Bruce D. Baer, St. George, UT (US); Chris McArthur, Washington, UT (US); Leo Wright, La Verkin, UT (US); Kyle Bodily, Santa Clara, UT (US); Nathaniel Johnson, Ivins, UT (US); Brian Hunt, Washington, UT (US); Erik Erekson, St. George, UT (US); Spence Rencher, Washington, UT (US)

(73) Assignee: Reid-Ashman Manufacturing, Inc., St. George, UT (US)

( * ) Notice: Subject to any disclaimer, the term of this patent is extended or adjusted under 35 U.S.C. 154(b) by 0 days.

(21) Appl. No.: 16/860,029

(22) Filed: Apr. 27, 2020

(65) Prior Publication Data

US 2020/0393508 A1 Dec. 17, 2020

Related U.S. Application Data

(62) Division of application No. 15/728,206, filed on Oct. 9, 2017, now Pat. No. 10,634,718.

(Continued)

(51) Int. Cl.
*G01R 19/00* (2006.01)
*G01R 31/00* (2006.01)
(Continued)

(52) U.S. Cl.
CPC .......... *G01R 31/2893* (2013.01); *B25J 5/007* (2013.01); *B25J 15/00* (2013.01); *G01R 31/2867* (2013.01);
(Continued)

(58) Field of Classification Search
CPC ........ G01R 19/00; G01R 31/00; G01R 31/28; G01R 1/00; G01R 1/04; G01R 1/073; G01D 21/00
See application file for complete search history.

(56) References Cited

U.S. PATENT DOCUMENTS 4,530,062 A 7/1985 Inaba et al.
6,766,996 B1* 7/2004 Somers .............. G01R 31/2887
248/123.11

(Continued)

FOREIGN PATENT DOCUMENTS

DE 100 16 530 C1 10/2001
JP S58-90486 5/1983
(Continued)

OTHER PUBLICATIONS

Information about Related Patents, Patent Applications, and Patent Office Proceedings.

(Continued)

*Primary Examiner* — Neel D Shah
(74) *Attorney, Agent, or Firm* — FisherBroyles, LLP

(57) ABSTRACT

A manipulator may include a base portion, an upright portion connected to the base portion, a test head attachment incorporated into the upright portion, and an upright quick connect assembly incorporated into the test head attachment. In some cases, the manipulator includes an automatic weight transfer mechanism, a mobile base portion with casters and/or steerable casters.

21 Claims, 14 Drawing Sheets

Related U.S. Application Data

(60) Provisional application No. 62/406,235, filed on Oct. 10, 2016.

(51) Int. Cl.
   *G01R 31/28* (2006.01)
   *G01R 1/073* (2006.01)
   *B25J 15/00* (2006.01)
   *B25J 5/00* (2006.01)

(52) U.S. Cl.
   CPC ...... *G01R 31/2887* (2013.01); *G01R 31/2891* (2013.01); *Y10S 901/01* (2013.01)

(56) References Cited

U.S. PATENT DOCUMENTS

| | | | |
|---|---|---|---|
| 6,838,868 B1 * | 1/2005 | Bosy | G01R 31/2887 324/750.22 |
| 9,557,371 B2 * | 1/2017 | Weissacher | G01R 31/2887 |
| 10,094,854 B2 * | 10/2018 | Fowler | G01R 1/0416 |
| 2005/0127897 A1 | 6/2005 | Bosy et al. | |
| 2009/0024142 A1 | 1/2009 | Ruiz Morales | |
| 2009/0145241 A1 * | 6/2009 | Cowgill | G01N 3/04 73/828 |
| 2009/0252587 A1 | 10/2009 | Mischler et al. | |
| 2010/0277195 A1 | 11/2010 | Daoudi et al. | |
| 2011/0241716 A1 | 10/2011 | Doi | |
| 2012/0048656 A1 | 3/2012 | West et al. | |

FOREIGN PATENT DOCUMENTS

| | | |
|---|---|---|
| JP | S59-43792 | 3/1984 |
| JP | H05175290 A | 7/1993 |
| JP | H0730929 A | 1/1995 |
| JP | H07-328963 | 12/1995 |
| JP | H08-108334 | 4/1996 |
| JP | H08222891 A | 8/1996 |
| JP | 2000-91794 A | 3/2000 |
| JP | 2003336483 A | 11/2003 |
| JP | 2016-30320 A | 3/2016 |
| KR | 10-2001-0107216 | 12/2001 |
| KR | 10-1343910 | 12/2013 |
| WO | WO-2007/015952 | 2/2007 |

OTHER PUBLICATIONS

Information Submitted in Parent Applications, see MPEP 609.02.
U.S. Appl. No. 16/860,029, filed Apr. 27, 2020, Reid-Ashman Manufacturing, Inc., Manipulator for Moving a Test Head.
U.S. Appl. No. 15/728,206, filed Apr. 12, 2018, Reid-Ashman Manufacturing, Inc., Manipulator for Moving a Test Head.

* cited by examiner

MANIPULATOR FOR MOVING A TEST HEAD

BACKGROUND

Test head manipulator technology is used in the semiconductor testing industry to hold and position test heads for testing semiconductor products (IC dies and computer chips). The manipulator also repositions the test head for service and maintenance. In the semiconductor testing industry, test floor space is at a premium. Existing methods of test head manipulation generally use a single manipulator that is always attached to the test head for each test cell with additional service space for the maintenance of equipment and other operations. As some semiconductor test companies increase the number of test cells, the area generally reserved for the manipulator and service access is removed, resulting in little to no space to perform traditional test head manipulation and services.

An example of a manipulator is disclosed in U.S. Pat. No. 7,312,604 issued to Paul Trudeau, et al. In this reference, a manipulator is described for positioning a test head relative to a prober or other reference. The manipulator has a frame, a linkage coupled to the frame and including first and second links having freedom of rotation about respective pivots and a third link coupled to the first and second links such that the third link has translational and rotational degrees of freedom of movement, and an adaptor coupled to the third link and configured to attach to a test head.

Another example of a manipulator is disclosed in U.S. Pat. No. 5,931,048 issued to Alexander H. Slocum, et al. In this reference, a manipulator for a test head is connected to automatic test equipment through a heavy, inflexible cable. The manipulator includes a telescoping column assembly to which is mounted a vertical member. A cradle holding the test head is mounted to the vertical member. The cable is clamped at the vertical member to reduce the amount of force exerted by the cable on the test head. The cradle includes movable members to allow fine positioning of the test head, while maintaining the test head isolated from cable force. Coarse motion of the test head may be made by moving portions of the manipulator on the opposite side of the cable clamp from the test head. Precise positioning of the test head relative to a handling device is accomplished through a positioning mechanism at the interface between the test head and the handling device. To allow the positioning mechanism to operate, the manipulator has compliance which allows the test head to be forced into position by the positioning mechanism. Both of these references are herein incorporated by reference for all that they contain.

SUMMARY

In some embodiments, a manipulator includes a base portion, an upright portion connected to the base portion, test head attachment incorporated into the upright portion, and a first quick connect assembly incorporated into the test head attachment.

The manipulator may include a second quick connect assembly incorporated into the base portion.

The base portion may include an extendable outrigger and the second quick connect assembly is incorporated into the extendable outrigger.

The manipulator may include a steerable caster incorporated into the base portion The manipulator may include a weight transfer mechanism.

The weight transfer mechanism may dynamically adjust for the weight of a test head when the manipulator is connected to the test head and the manipulator lifts or places the test head on or off of a weight bearing structure.

The weight bearing structure may be a prober.

The weight transfer mechanism may include a manipulator face configured to connect to a test head and a sag motor that controls an angle of the manipulator face.

The weight transfer mechanism may include a level sensor to determine a level of a test head when the test head is connected to the manipulator through the first quick connect assembly.

The sag motor may continuously adjust a level of the test head as the manipulator moves the test head off of a platform.

The first quick connect assembly may include a protrusion and a locking element located within the protrusion. In some cases, the locking element may be an expandable element where the protrusion is sized to be inserted into a receptacle of the test head and the locking element can be expanded away from a central axis of the protrusion to interlock with receptacle. In other examples, the locking element can move inward towards a central axis to grip a component of the receptacle. In one embodiment, a method of moving a test head off of a prober includes attaching a first manipulator to the test head through a first quick connect assembly, attaching a second manipulator quick connect assembly of the manipulator to a prober supporting the test head, and lifting the test head with the manipulator.

The method may include adjusting a level of the test head with a sag motor as the test head is being lifted based on an increasing amount of weight loaded to the manipulator.

The method may include independently moving the second quick connect assembly into a position to connect to a base of the manipulator to the prober.

Moving the second quick connect assembly may include moving the second quick connect assembly on an outrigger connected to the base of the manipulator.

The method may include inserting a protrusion of the second quick connect assembly into a receptacle of the test head and moving a locking element of the protrusion with respect to a central axis of the protrusion to interlock with the receptacle.

The method may include continuously measuring a level of the test head while lifting the test head.

Attaching the second manipulator quick connect assembly of the manipulator to the prober may occur before attaching the first manipulator to the test head through the first quick connect assembly.

In one embodiment, a manipulator includes a base portion, an upright portion connected to the base portion, a first quick connect assembly incorporated into an upright portion, an outrigger connected to a base portion, and a second quick connect assembly attached to the outrigger.

The manipulator may include a weight transfer mechanism incorporated into the manipulator. The weight transfer mechanism may include a sag motor and a level sensor in communication with the sag motor. The weight transfer mechanism dynamically adjusts an angle of a face of the first quick connect assembly when the test head is being lifted in response to outputs from the level sensor.

DRAWINGS

The accompanying drawings illustrate various embodiments of the present apparatus and are a part of the specification. The illustrated embodiments are merely examples of the present apparatus and do not limit the scope thereof.

Throughout the drawings, identical reference numbers designate similar, but not necessarily identical, elements.

DETAILED DESCRIPTION

Figure 1:
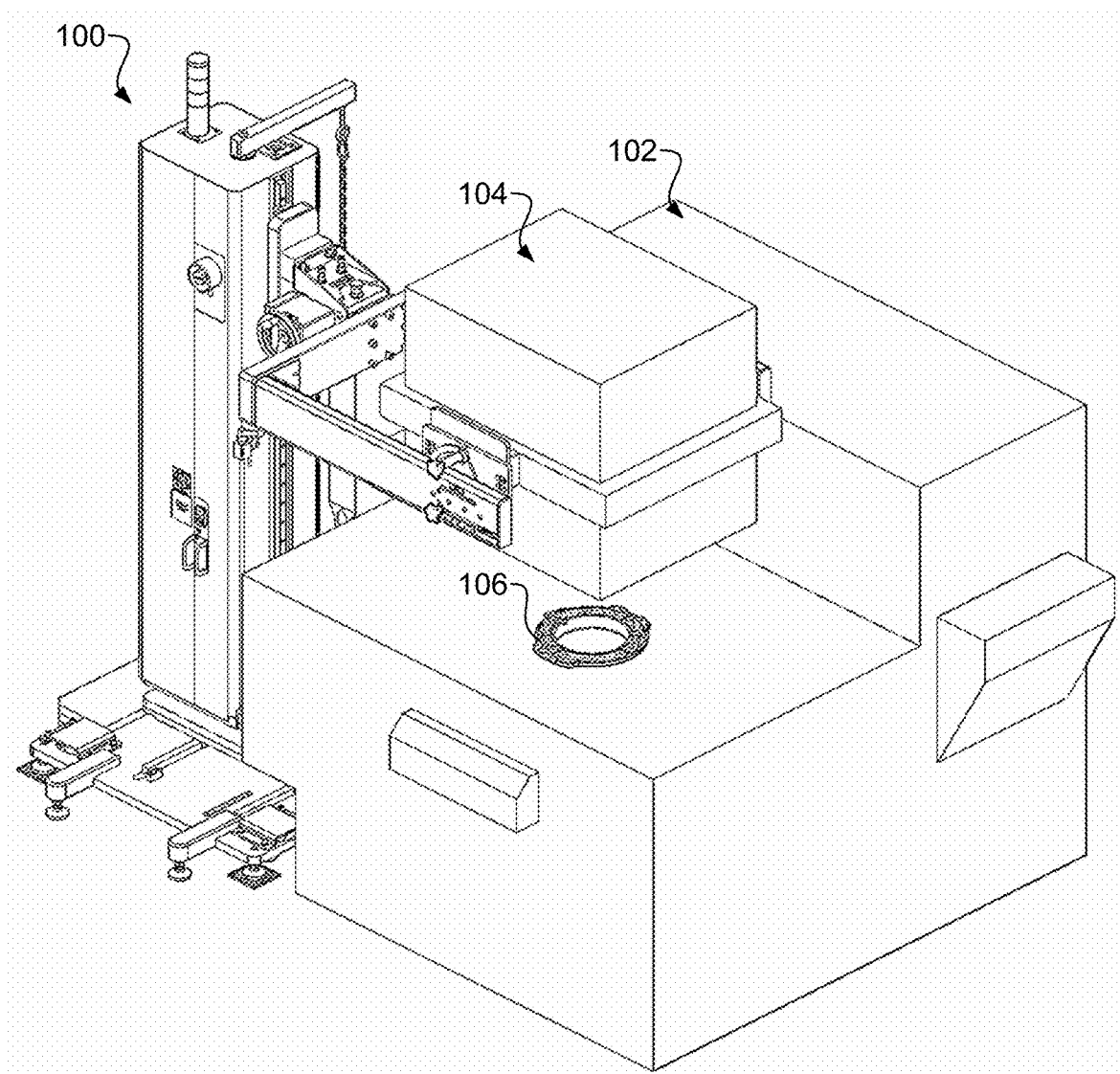
FIG. 1 depicts a perspective view of an example of a test cell and a manipulator in accordance with the present disclosure.

For purposes of this disclosure, the term "aligned" means parallel, substantially parallel, or forming an angle of less than 35.0 degrees. For purposes of this disclosure, the term "transverse" means perpendicular, substantially perpendicular, or forming an angle between 55.0 and 125.0 degrees. Also, for purposes of this disclosure, the term "length" means the longest dimension of an object. Also, for purposes of this disclosure, the term "width" means the dimension of an object from side to side. Often, the width of an object is transverse the object's length.

Additionally, for purposes of this disclosure, the term "test cell" generally means a set of equipment arranged for testing semiconductors. For purposes of this disclosure, the term "test floor" generally refers to production space containing multiple test cells. Also, for purposes of this disclosure, the term "service area" generally refers to floor space or area used for performing service to a particular piece of equipment within a test cell. Space for the technician to perform the service is included in the service area for servicing the equipment.

For purposes of this disclosure, the term "test head" generally refers to a testing device for wafer and/or chip testing. Sometimes a test head is referred to as a tester. For purposes of this disclosure, the term "manipulator" generally refers to a holding device used to support the test head and move the test head. For purposes of this disclosure, the term "prober" generally refers to a wafer prober used to test integrated circuits (IC). Often, the prober holds the wafer on a chuck by vacuum and moves the wafer to a test site where the wafer interfaces with the test head.

For purposes of this disclosure, the term "handler" generally refers to an automated placement machine. During the final phase of testing, a handler places the chip or IC chip into a test site for testing by the test head. For purposes of this disclosure, the term "tower" generally refers to an interface between the test head and an internal testing mechanism of the prober. In some cases, the tower can transmit power and/or signals. For purposes of this disclosure, the term "peripheral" generally refers to any piece of testing equipment that the manipulator would present to the test head. Often, a prober or a handler are considered peripherals.

For purposes of this disclosure, the term "test equipment" generally refers to any equipment within the test cell used during the testing process. The handler, prober, tower or other equipment can be referred to as test equipment. For purposes of this disclosure, the term "outrigger" generally refers to any extension of a piece of equipment that reaches out for stabilizing and/or connecting with the manipulator. For purposes of this disclosure, the term "deflection" generally refers to movement of a body due to the exertion of and external force on a body. The deflection may refer to elastic movement of the manipulator when the weight of the test head is transferred to and from the manipulator. For purposes of this disclosure, the term "home position" of a manipulator generally refers to a position where a manipulator and test head attach before the manipulator moves the test head off the prober. For purposes of this disclosure, the term "service position" of a manipulator generally refers to any position the manipulator moves the test head to for servicing.

For purposes of this disclosure, the term "mobile" generally refers to a transportable nature of the manipulator by a single technician to be moved to various locations without the assistance of other equipment or additional persons. For purposes of this disclosure, the term "steerable caster" generally refers to an ability to be oriented in a particular direction by the manual input of the technician. For purposes of this disclosure, the term "slave caster" generally refers to a caster that rolls in the direction of travel. For purposes of this disclosure, the term "drive caster" generally refers to a motorized caster that drives forward or backward with electrical input. For purposes of this disclosure, the term "quick connect" generally refers to an ability to mechanically connect to the test head or peripheral without the use of tools or fasteners. For purposes of this disclosure, the term "manipulator side" generally refers to a quick connect device to the test head permanently mounted to the manipulator. For purposes of this disclosure, the term "head side" generally refers to a quick connect device to the test head permanently mounted to the test head. For purposes of this disclosure, the term "prober side" generally refers to a quick connect device to the prober permanently mounted to the prober.

Traditional or conventional test head probers generally have a dedicated manipulator per prober. This involves dedicated floor space for a manipulator and a designated service area to perform service and head installation for each test cell. In this arrangement, the manipulator is generally fastened to the test head. When service or maintenance is desired on the test head, the manipulator moves the test head into the service area. In addition, when a test head is installed, an area is reserved for the installation of the test head into the manipulator.

The manipulator can quickly attach to and detach from the test head and/or peripheral equipment without disruption of adjacent test cells without the use of additional tools or fasteners. The manipulator dynamically adjusts for the entire test head weight transferred to or from the manipulator using automated positioning as the test head is moved from the prober or other test equipment. In some cases, the manipulators can attach to multiple test heads. This may be done by sequentially servicing each of the test heads in different cells. The manipulator may be moved or programmed to move from one cell to the next after completing the service needs at each cell. As the manipulator moves from each cell to the next, the manipulator may connect to and disconnect from test heads for servicing without adjustment to cell peripherals. In these examples, the manipulator may be moved manually or with a motorized drive caster.

The principles described herein include a manipulator that expeditiously connects to the test head and moves it to the service area. The manipulator enables the customer to install and/or service the test head in an aisle between test cells or another location. In some cases, the manipulator is stored off of the test floor to avoid taking up unnecessary space on the test floor. The manipulator's ability to quickly connect to the test head and move the test head quickly into the aisle for servicing may enabled the customer to condense the test cells without losing the ability to quickly and efficiently service, maintain, and install test heads on the test floor.

The benefits of the manipulator as described herein may include enabling semiconductor test companies to maximize the use of floor space while still providing access to perform service to the test heads. The manipulator may also enable semiconductor test companies to reduce and/or eliminate the floor space that has traditionally been designated for dedicated manipulators that were associated with each cell. With the principles of the present disclosure, a single manipulator may be dedicated to multiple test cells rather than just one test cell. The manipulator may also enable semiconductor test companies to increase the number of test cells on the test floor by reducing the floor space previously used by the manipulator footprint and the dedicated service area surrounding each of the manipulators. The advantages may be realized by the manipulator while continuing to service each test head in an amount of time comparable to traditional test head manipulation.

Figure 2:
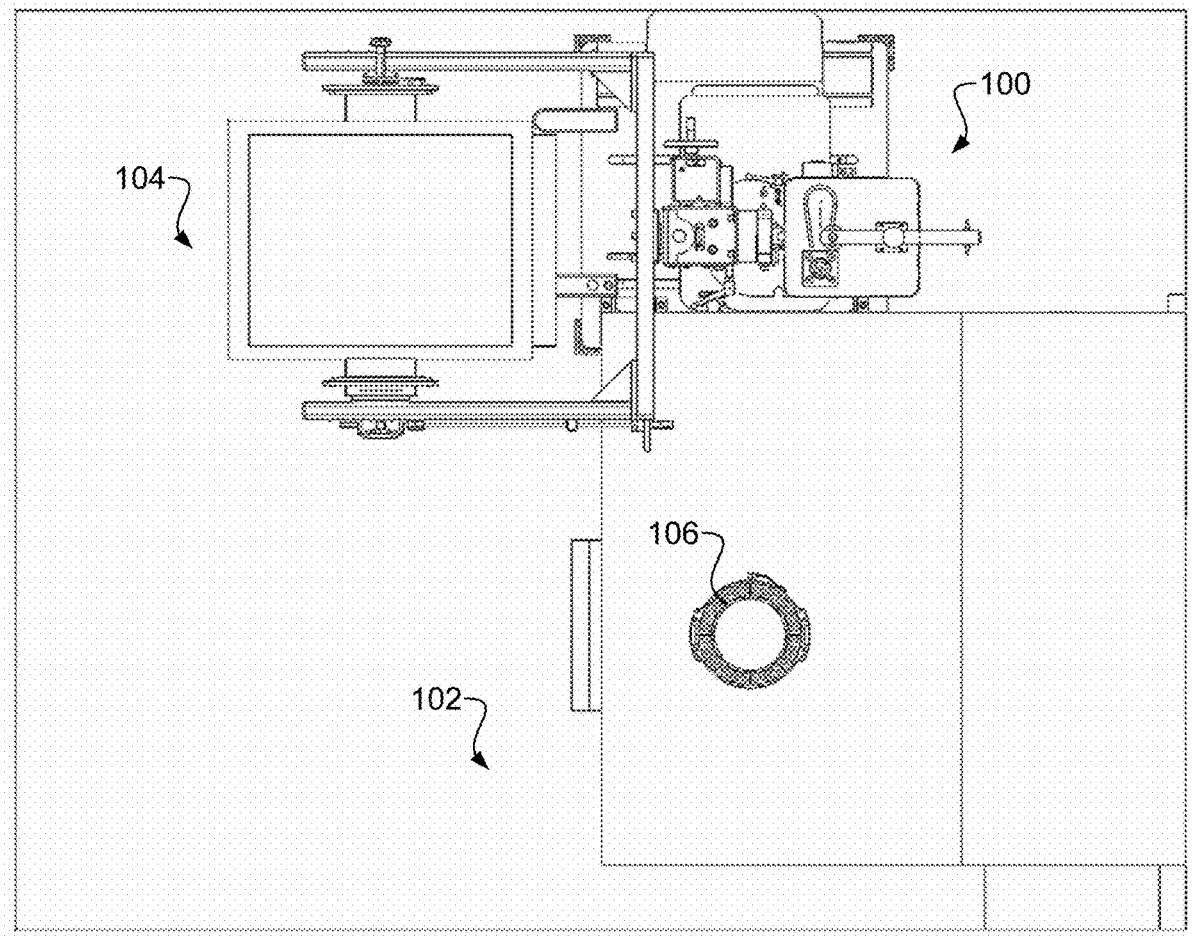
FIG. 2 depicts a top view of an example of a test cell and a manipulator in accordance with the present disclosure.

FIGS. 1-2 depict an example of a manipulator 100 adjacent to a prober 102. FIG. 1 depicts a perspective view of an example of the manipulator 100 holding a test head 104. In this example, the test head 104 is positioned over a tower 106 incorporated into the prober 102. The manipulator 100 is holding the test head 104. FIG. 2 depicts an example of the manipulator 100 holding the test head 104 away from the tower 106.

The prober 102 is a machine that contains wafers, dies, integrated circuits, or other testable devices. These devices are stored within the prober 102, and the prober 102 contains mechanisms for moving the testable devices to the tower 106. When situated on the tower 106, the test head 104 can perform at least one of a number of tests on the testable devices. For example, in some cases, the test head 104 may determine whether portions of the circuitry are operating correctly.

From time to time, it may be desirable to perform maintenance on the test head 104 or perform another type of service on the test head 104. Due to the test head's weight, a technician is not likely able to lift the test head 104 and perform the maintenance in place. Rather, it may be desirable to lift the test head 104 off of the prober 102 and move the test head 104 into the space adjacent to the prober 102 to give the technician more access. In these situations, the manipulator 100 may be brought adjacent to the prober 102 to move the test head 104.

Figure 3:
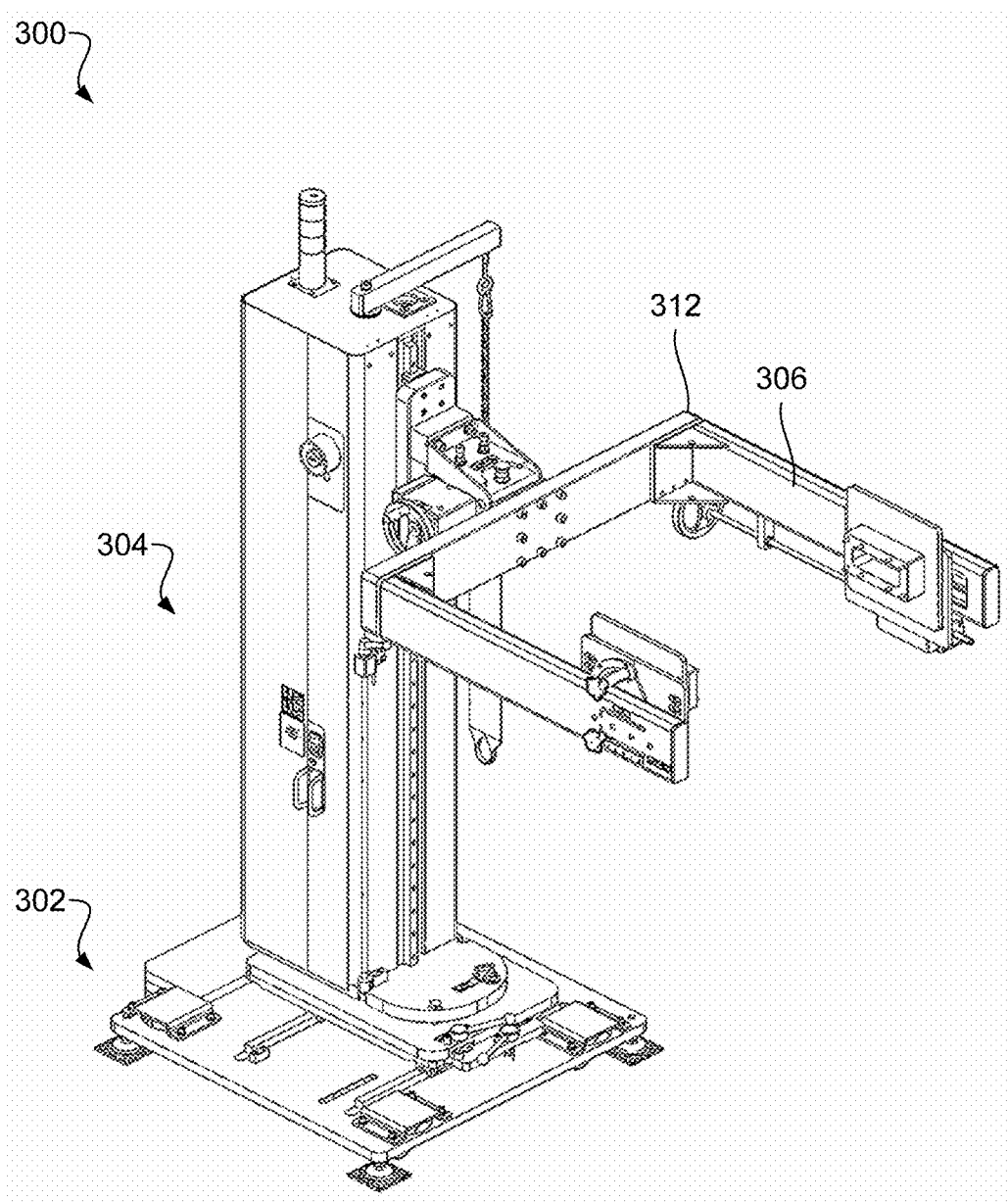
FIG. 3 depicts a perspective view of an example of a manipulator in accordance with the present disclosure.

FIG. 3 depicts an example of the manipulator 300. In the illustrated example, the various components of the manipulator 300 and their associated movements are depicted. The manipulator 300 may include a base portion 302 and an upright portion 304. Arms 306 may extend from the upright portion 304 that can be used to connect to the test head. The arms 306 can be connected by a cross beam 312 that is attached at a single location to the upright portion 304. The upright portion 304 of the manipulator 300 can move laterally with respect to the base portion 302 of the manipulator.

Figure 4:
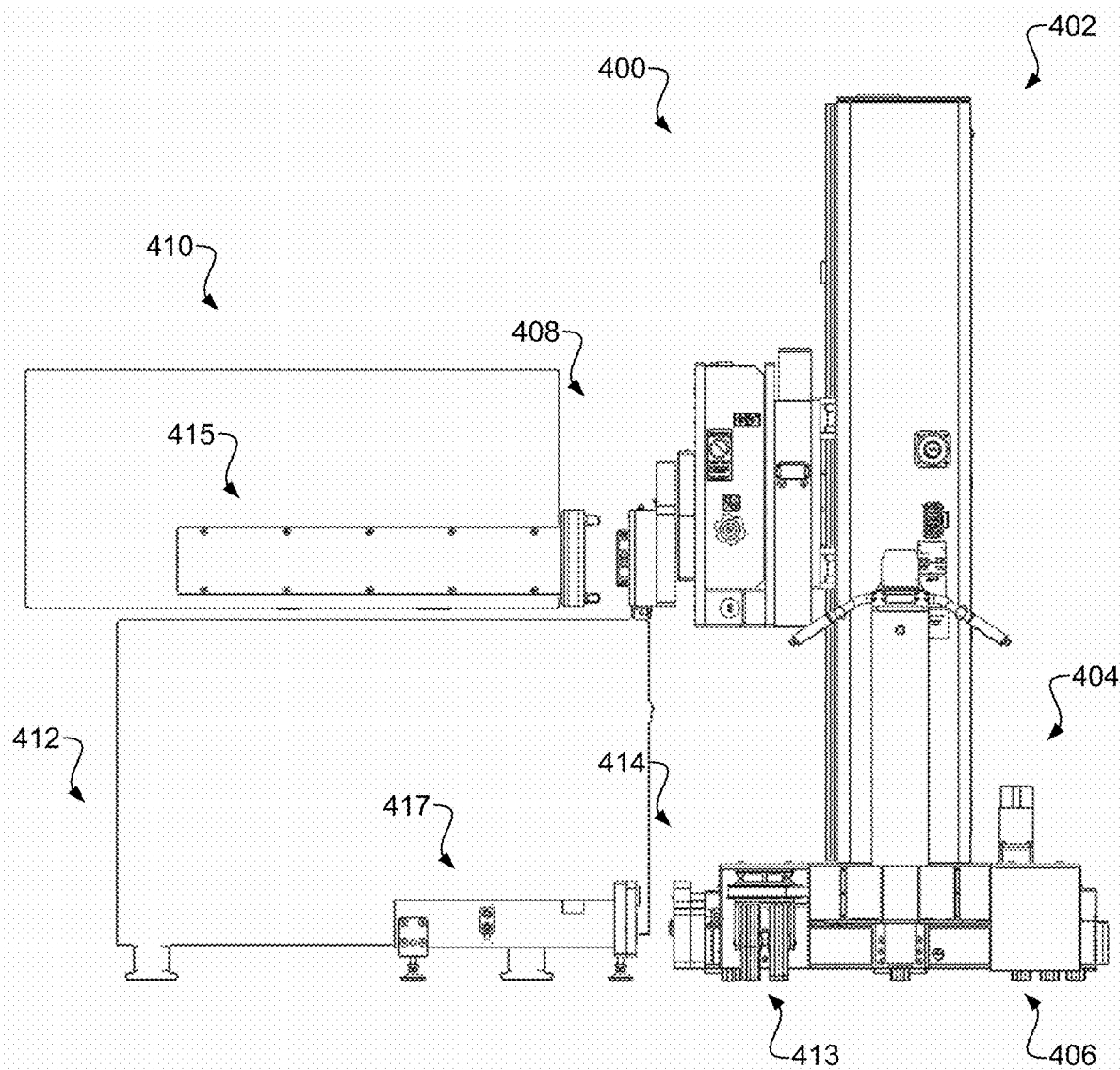
FIG. 4 depicts a side view of an example of a manipulator disconnected from a prober in accordance with the present disclosure.
Figure 5:
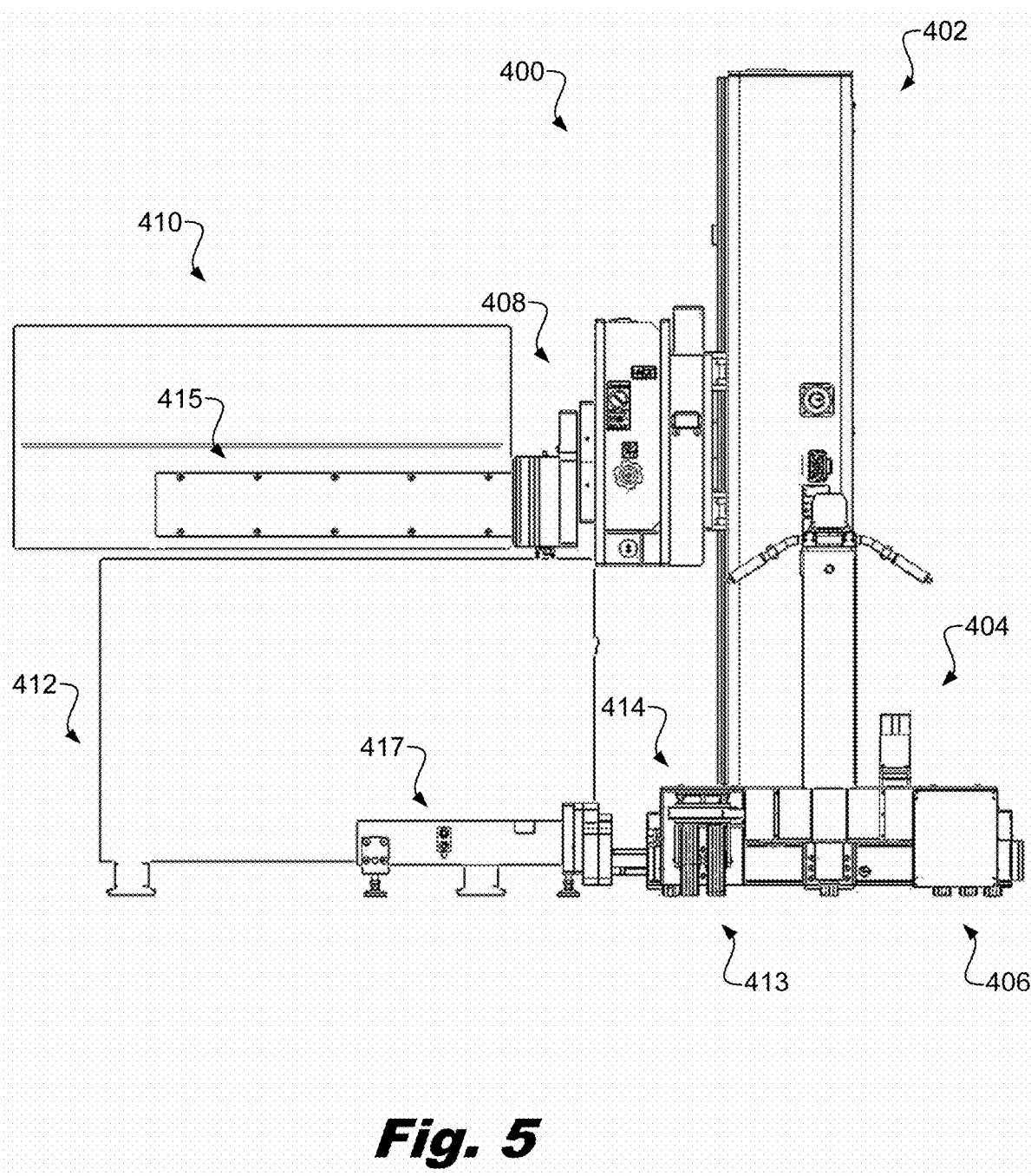
FIG. 5 depicts a side view of an example of a manipulator connected to a prober in accordance with the present disclosure.

FIGS. 4-5 depict another example of a manipulator 400. In this example, the manipulator 400 includes an upright portion 402 and a base portion 404. The base portion 404 may be mobile. In some cases, the base portion 404 is movable about the floor with a set of steerable casters 406 incorporated into the manipulator 400.

A first quick connect assembly or connection assembly 408 may be connected to the upright portion 402 of the manipulator 400. The first quick connect assembly 408 may connect directly to the test head 410 secured to the prober 412 or the first quick connect assembly 408 may connect indirectly to the test head 410 by connecting to an object that is connected to the test head 410. In this case, a connecting structure or arm 415 is connected to the test head 410, and the first quick connect assembly 408 connects to the arm 415.

A second quick connect assembly or connection assembly 414 may be connected to the base portion 404 of the manipulator 400. The second quick connect assembly 414 may connect directly to the prober 412 or the second quick connect assembly 414 may connect indirectly to the prober 412 by connecting to an object that is connected to the prober 412. In this case, a prober stick 417 is connected to the prober 412, and the second quick connect assembly 414 connects to the prober stick 417.

In the example of FIG. 4, both the first quick connect assembly 408 and the second quick connect assembly 414 are shown disconnected from the test head 410 and prober 412 respectively. To position the manipulator 400 to connect to the test head 410 and/or the prober 412, the manipulator's base portion 404 may be moved into position with the steerable casters 406. This may allow an operator to manually position the manipulator 400 at the prober 412. In other examples, at least one of the casters is an electrically driven caster, and the base portion 404 of the manipulator 400 can be electrically moved into place. In yet other examples, the manipulator can self-position itself adjacent to the prober 412. Location sensors, like a global positioning system (GPS), magnetic sensors, inertial sensors, other types of sensors, or combinations thereof, can determine the manipulator's location to determine whether the manipulator 400 is in the correct test cell and/or aligned for making connections with the first and second quick connect assemblies. Other sensors may be used to determine the manipulator's relative position with the prober 412, test head 410, other test equipment, or combinations thereof.

In some cases, when the base portion 404 is moved to connect with the prober 412, the base portion 404 is moved up against the prober 412 so that the second quick connect assembly 414 is in physical contact with the prober 412. In other examples, when the base portion 404 is moved to connect to the prober 412, the second quick connect assembly 414 may be spaced at a distance away from the prober 412 leaving a gap between the prober 412 and the second quick connect assembly 414.

To connect the manipulator 400 to the test head 410, the second quick connect assembly 414 may be moved into place to engage the prober 412. This may be done by moving the second quick connect assembly 414 towards the prober 412 to interlock with the prober 412. The second quick connect assembly 414 may be moved into place with a movable outrigger 413. In some cases, the movable outrigger 413 includes a telescoping portion that may extend from the base portion 404 of the manipulator 400 to engage the prober stick 417 or another type of attachment point on the prober 412. Through electronic sensors, the operator may know when the second quick connect assembly 414 is in position to attach to the prober 412 and/or prober stick 417. The operator may cause the outrigger 413 to move to make a connection between the second quick connect assembly 414 and the prober 412 using a touchscreen interface or another type of control interface.

In some cases, after the connection is made between the second quick connect assembly 414 and the prober 412, the first quick connect assembly 408 may connect to the arm 415 or another portion of the test head 410. However, in other cases, the connection between the second quick connect assembly 414 and the prober 412 may be made before the connection between the first quick connect assembly 408 and the test head 410 or at the same time. In some cases, the operator may attach the manipulator 400 to the test head using the touchscreen interface that was used to connect the second quick connect assembly 414 to the prober 412. FIG. 5 depicts an example of the first and second quick connect assemblies 408, 414 connected to the arm 415 and prober sticks 417.

To remove the test head 410 from the prober 412, the operator may select a predetermined service position using the touchscreen interface. The manipulator 400 may then move the test head 410 to that service position as desired. When lifting and traveling to the service position, the manipulator 400 may go through an automated sequence to compensate for deflection due to the weight of the test head 410. After service or maintenance has been performed on the test head 410, the operator may select to return the test head 410 to the prober 412. In response to being in position on the prober 412, the operator may give a command to detach the test head 410 from the manipulator 400. Accordingly, the manipulator 400 may release the test head 410. When releasing the test head 410, the automated weight transfer mechanism may compensate for the weight transfer from the manipulator 400 back to the prober 412.

At that point, if all service is complete on the test head 410, the operator may give a command to detach the manipulator 400 from the prober 412 by disconnecting with the first quick connect assembly 408. Once detached, the operator may roll the manipulator 400 away from the test cell manually or use the motorized drive. In other examples where the manipulator 400 is self-driving, the manipulator 400 may move to the next assigned cell or to another location after disconnecting from the prober 412, test head 410, and other peripherals.

To accommodate the connection between the first quick connect assembly 408 and the upright portion 402, the connection unit and/or manipulator may slide in and out, roll in any direction, rotate about a z-axis, move side to side, slide side to side, move in another direction, move in another way, or combinations thereof. The manipulator 400 may move in any appropriate way to position the test head 410 in a desirable space for servicing and/or placing the test head 410 on the prober or prober's tower.

In some examples, the first and second quick connect assemblies include a manipulator side and a prober side. The manipulator side of the quick connect assembly may be incorporated into the outrigger which can move into and away from the prober. The prober side of the peripheral quick connect may receive the manipulator side of the peripheral quick connect. When moved together, the manipulator side and the prober side connect to one another to create a connection. In some cases, the quick connect may not involve tools or external fasteners to make the connection.

Generally, the connection at the base portion is formed before the connection is formed at the test head. This first connection allows the manipulator to be stabilized by the prober and also orients the manipulator. With the first connection made, the manipulator may attach to the test head with the arm or an adapter. The first connection can be made by moving the arms or adapter towards the test head. The test head quick connect assembly may include a head side and a manipulator side. As the manipulator side approaches the test head, the manipulator side may engage the head side of the quick connect forming a connection between the test head and the manipulator.

The prober side of the first connect and the head side of the test head quick connect may include a permanent structure. The prober may have one or more prober stick that can receive their respective manipulator sides of the quick connects. The test head quick connect may have an arm or connecting structure to receive their respective manipulator sides of the quick connects. These prober side and manipulator sides of the connections may be the same or at least similar to those of the test cells. This allows the manipulator to make and unmake quick connections with the probers and test heads in other test cells.

FIG. 5 depict examples with the first quick connect assembly 408 connected to the test head 410 through the test head arm 415 and the second quick connect assembly 414 connected to the prober 412 through the prober stick 417. With both the connections established, the manipulator may move the test head 410 to a service position for maintenance or other types of service.

Figure 6:
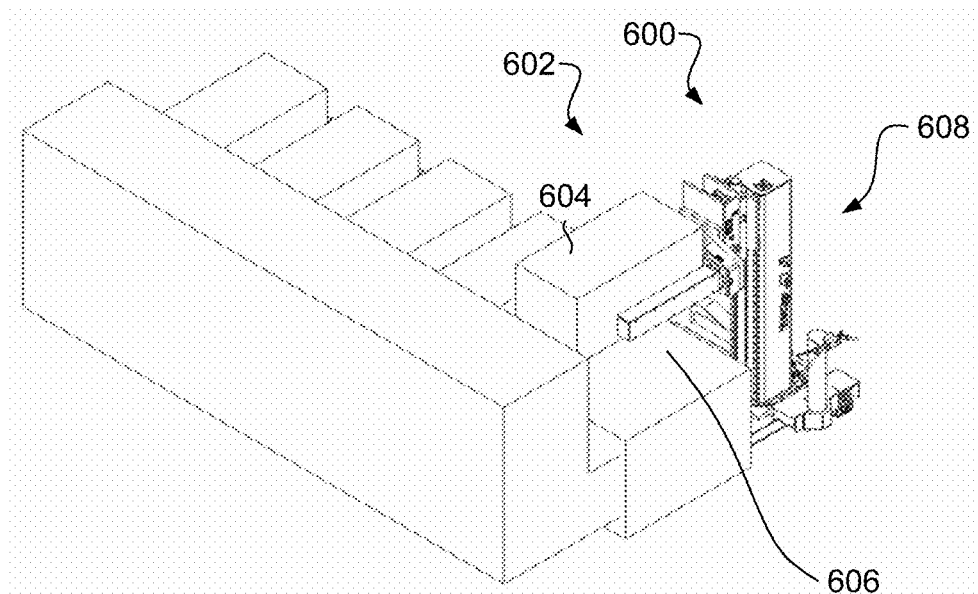
FIG. 6 depicts a perspective view of an example of a manipulator and multiple cells in accordance with the present disclosure.
Figure 7:
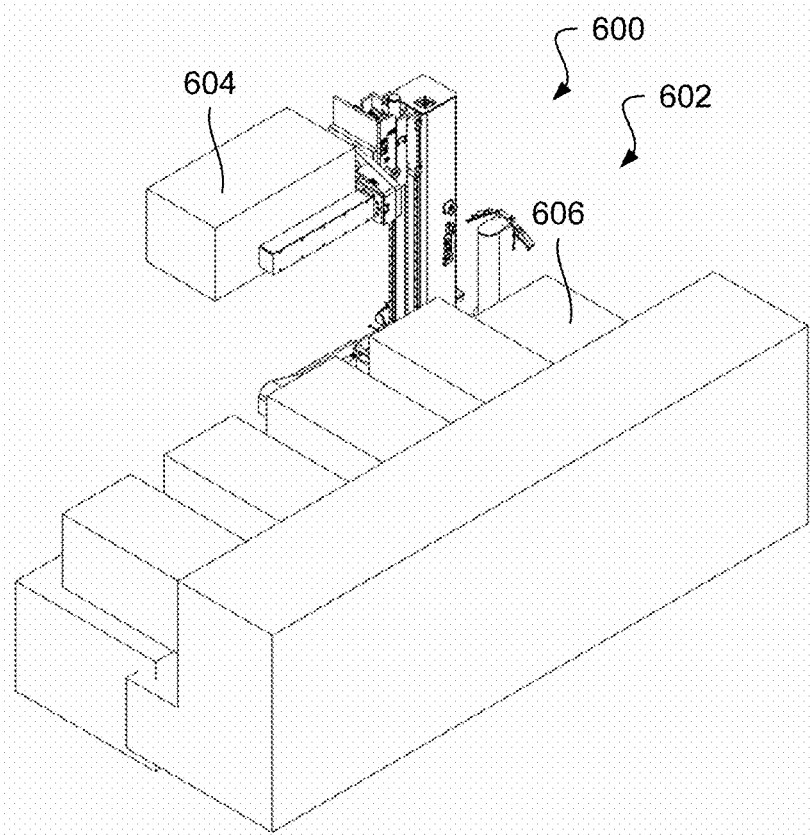
FIG. 7 depicts a perspective view of an example of a manipulator and multiple cells in accordance with the present disclosure.

FIG. 6 depicts an example of the manipulator 600 adjacent to multiple test cells. In this example, the manipulator 600 is positioned adjacent to a first test cell 602 and is lifting a test head 604 associated with the first test cell 602. In this example, the test head 604 is lifted up so that the test head 604 remains superjacent to the prober 606. FIG. 7 depicts an example where the manipulator 600 has rotated the arms 608 and, thus, the test head 604 is rotated away from being superjacent to the prober 606 and is now superjacent to the floor where no prober resides. This space may be between test cells, in an aisle between test cells, to the side of test cells, located within test cells, other appropriate locations, or combinations thereof. The manipulator 600 may adjust the test head's elevation to provide a desirable height for a technician to perform the services.

Figure 8:
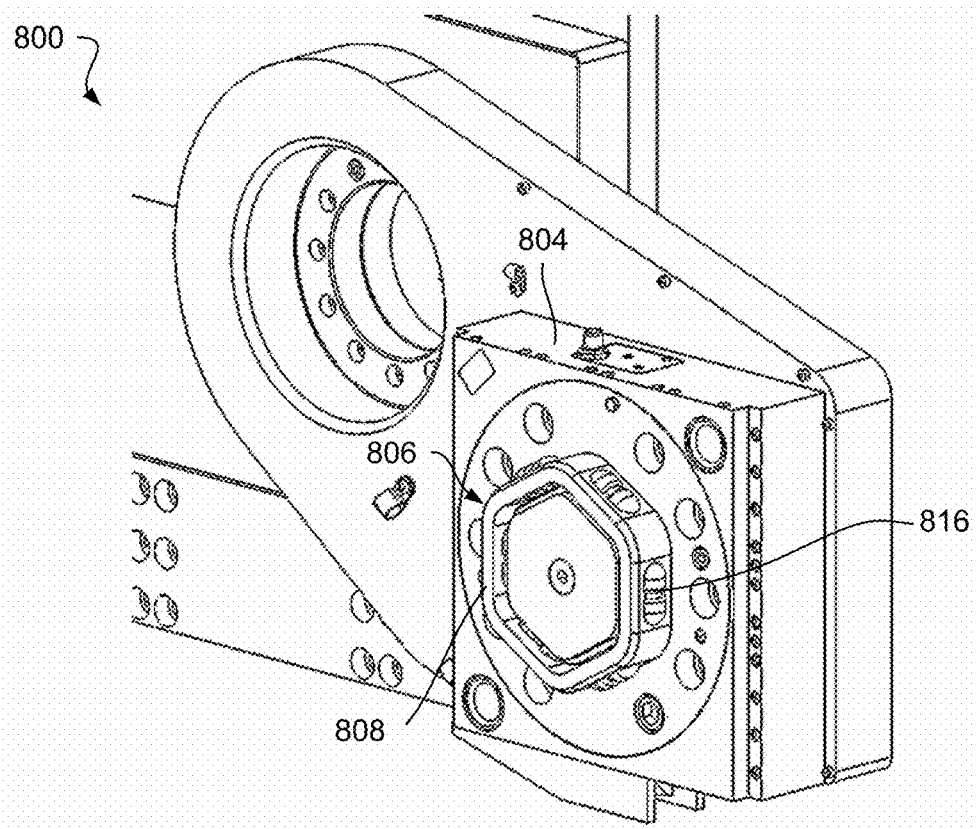
FIG. 8 depicts a perspective view of an example of a quick connect assembly of the manipulator in accordance with the present disclosure.
Figure 9:
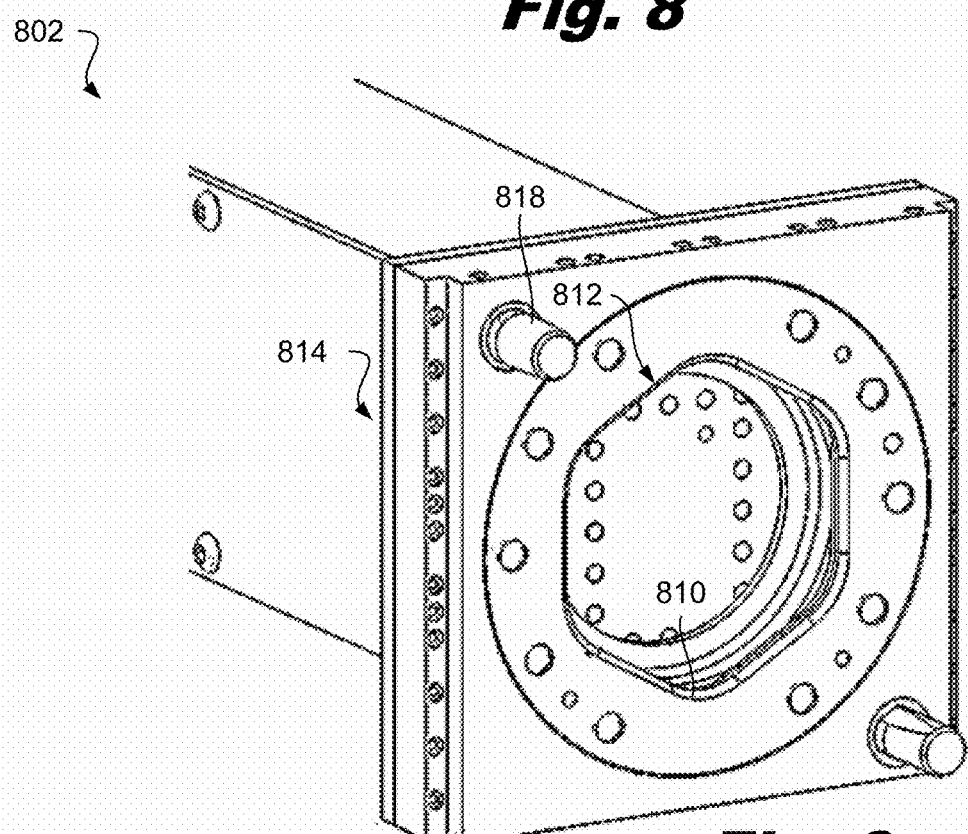
FIG. 9 depicts a perspective view of an example of a test head quick connect attachment in accordance with the present disclosure.

FIG. 8 depicts an example of the manipulator side 800 of the quick connection to the test head side. FIG. 9 depicts an example of the test head side 802 of the quick connection. Similar or different manipulator sides and head sides may be used for the test head quick connection. In these depicted examples, the manipulator side 800 includes a block 804 with a protrusion 806. In the depicted example, the protruding portion includes a hex shape 808 that matches the profile of a hex shape 810 of an opening 812 defined in a receptacle 814 of the test head side 802. While this example includes a hex shaped protrusion and a hex shaped opening defined in the receptacle, any appropriate shapes may be used to connect the manipulator side with the prober side.

When the protrusion 806 is inserted into the opening 812, at least one locking element 816 incorporated into the protrusion. In some cases, the locking element may be expanded to interlock the protrusion 806 with the receptacle 814. In other cases, the locking element may move inward towards a central axis to grip a portion of the receptacle. Any suitable type of locking elements may be used according to the principles disclosed herein. A non-exhaustive list of locking element types that may be suitable include, but are not limited to, expandable elements, collapsing elements, gripping elements, magnetic elements, screw-type elements, other types of elements, combinations thereof.

In this example, a pneumatically controlled element expands outward to catch on the inner rim of the receptacle 814. In some cases, when the pneumatically controlled elements are under a pneumatic pressure, the locking elements extend outward. When the pneumatic pressure level drops, the locking elements may retract back into the side of the protrusion. In alternative examples, the locking elements may lock into place when the locking elements extend a predetermined distance. This locking mechanism may retain the locking elements in place even when the pneumatic pressure drops. Thus, to engage the locking elements, the pneumatic pressure may be supplied temporarily to extend the locking element such that the locking element locks in place. Thus, the pneumatic pressure does not have to be supplied continuously during the entire duration that the connection is established. The locking mechanism may be caused to disengage the locking elements when it is desirable to retract the locking elements. In some situations, it may be desirable to reapply the pneumatic pressure to control the rate that the locking elements retract, especially in situations where the locking elements are under a high load. In other cases, another mechanism may be in place that controls the retraction of the locking elements.

While the illustrated example includes a pneumatically controlled locking element, any appropriate type of locking element may be used. For example, the locking element may be controlled with hydraulics, magnets, linear actuators, cams, other types of controlling mechanisms, or combinations thereof. In some cases, the locking elements pull the manipulator side (800, FIG. 8) and the prober side (802, FIG. 9) closer together as they expand putting at least some portions of the quick connection into compression. The quick connections may be constructed to stabilize the manipulator in generally lateral directions. In some cases, the protrusion and receptacle are shaped so that the manipulator self-aligns itself as the protrusion and the receptacle come together. In some cases, sensors are used to determine the relative locations of the sides of the quick connect.

In addition to the protrusion 806 being inserted into the opening 812 of the receptacle 814, alignment pins 818 of the receptacle 814 may also insert into the pin openings defined in the manipulator side's block 804. In other examples, the alignment pins are incorporated into the manipulator side and the pin openings are incorporated into the receptacle 814. The alignment pins 818 may provide a safety feature that prevents the quick connect attachments from disconnecting during a failure condition. Further, the alignment pins 818 may be in communication with sensors that provide feedback about the relative location of the manipulator side with the prober side/head side of the connection. In some cases, the alignment pins 818 are associated with pressure sensors that provide feedback about how secure the connection is.

The challenges of aligning the manipulator to the test cell and the stability of the manipulator when attached to the test head can be improved by knowing the orientation of the manipulator relative to the prober when preparing to attach. Permanent fixtures, such as the prober sticks or another type of permanent attachment, may be attached to the prober and provide a known reference location for the manipulator that is common to each test cell. A sensor may be attached to the self-aligning telescoping outrigger to provide angular feedback to know how far the swing must correct for alignment before attaching to the test head. The permanent fixtures may be set up on each test cell using a setup and alignment tool to ensure consistency between test cells.

These permanent fixtures may also become an extension of the manipulator when attached to the outrigger. This attachment may stabilize the manipulator when lifting the test head and moving it to service positions. Excessive pushing and pulling on the prober during attachment may be reduced and/or eliminated using a sensor system on the outrigger. This sensor may stop the outrigger's movement if the outrigger pushes too hard on the prober. The manipulator's base portion may have a stiffness and ballast that reduces deflection of the manipulator when loads are transferred to the prober through the permanent fixtures.

The time to connect to the test head may be reduced with an easily repeatable tool-less connection method that has the capability to support high moment loads. A self-contained locking device with positive mechanical engagement may be incorporated in to the quick connects. This locking device may normally be locked with the capability of releasing the mechanical engagement with external input from the operator or another source. In some cases, no tools have to attach or detach the test head from the manipulator. A sensor may be used to indicate when the locking device is locked or unlocked. In some cases, the manipulator has sensors that indicate when the manipulator is holding the test head. Safety features may be incorporated into the manipulator that prevent the operator from detaching the test head before the test head is safely supported by the prober.

Figure 10:
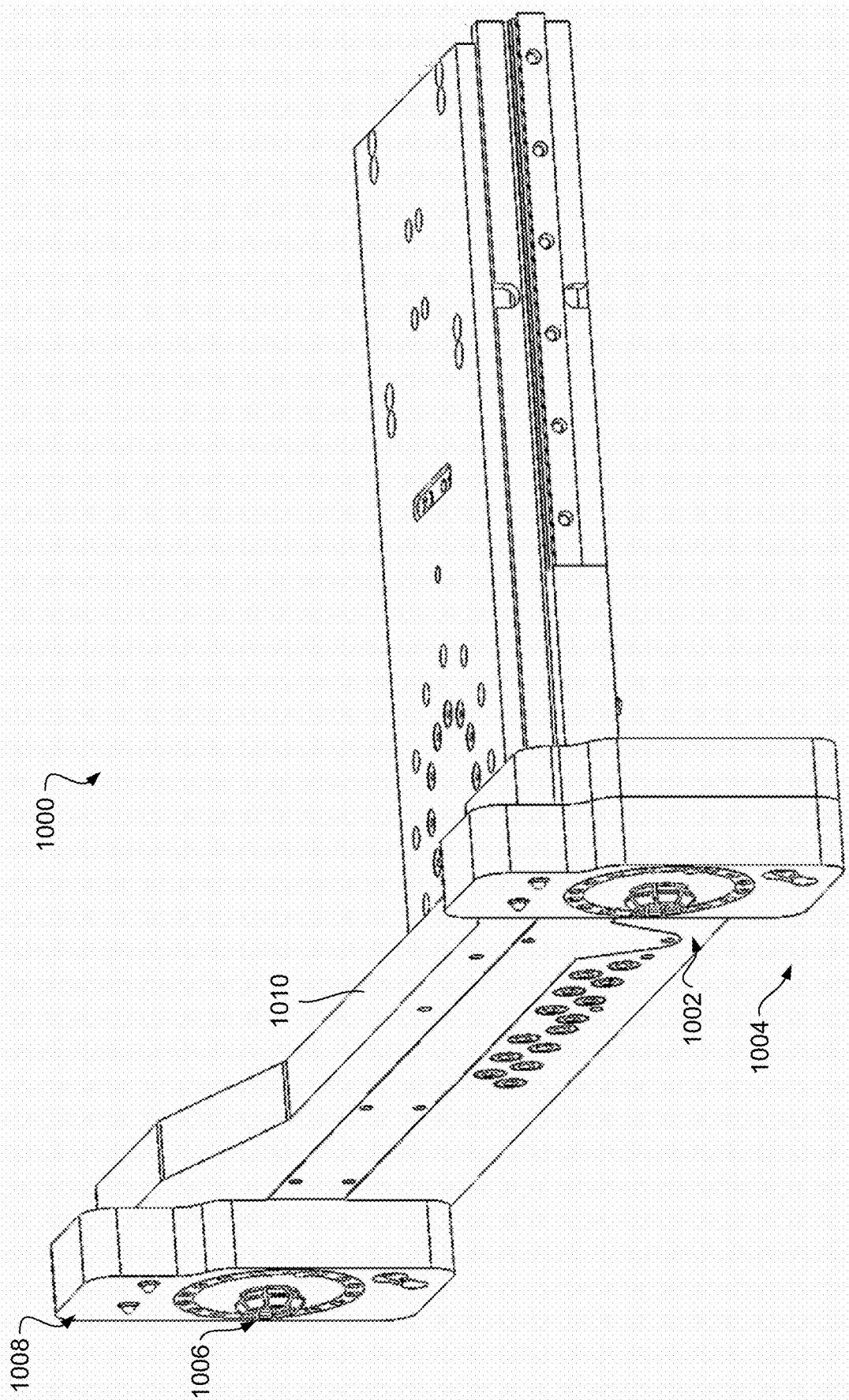
FIG. 10 depicts a perspective view of an example of an outrigger of a manipulator in accordance with the present disclosure.

FIG. 10 depicts an example of the outrigger 1000 with other components of the manipulator removed for illustrative purposes. In this example, a first quick connect 1002 is attached to the outrigger 1000 at a first side 1004 and a second quick connect 1006 is incorporated into the outrigger 1000 at a second side 1008. The first quick connect 1002 and the second quick connect 1008 are spaced apart from each other at a distance. In the illustrated example, each of the first quick connect 1002 and the second quick connect 1008 are incorporated into a unitary cross beam so that the first and second quick connects 1004, 1008 move together at the same pace. In other examples, the first quick connect 1002 may be independently movable with respect to the second quick connect 1008. The cross beam 1010 may be moved forward using any appropriate mechanism. For example, the cross beam may be slide along a track to connect with the prober side.

Any appropriate mechanism for expending the outrigger may be used in accordance with the principles described in the present disclosure. For example, the outrigger may include a telescoping portion that slides along a length of a track. The outrigger may move in a manner that prevents the disruption of the adjacent testing cells. Sensors may help determine the outrigger's relative location with the prober and locking mechanisms may be used to maintain the desired position of the outrigger.

In some cases, the quick connects may incorporate wiring or ducts so that when the quick connects mechanically connect the manipulator to the prober and/or the test head, an electrical connection or a pneumatic connection is automatically established.

Figure 11:
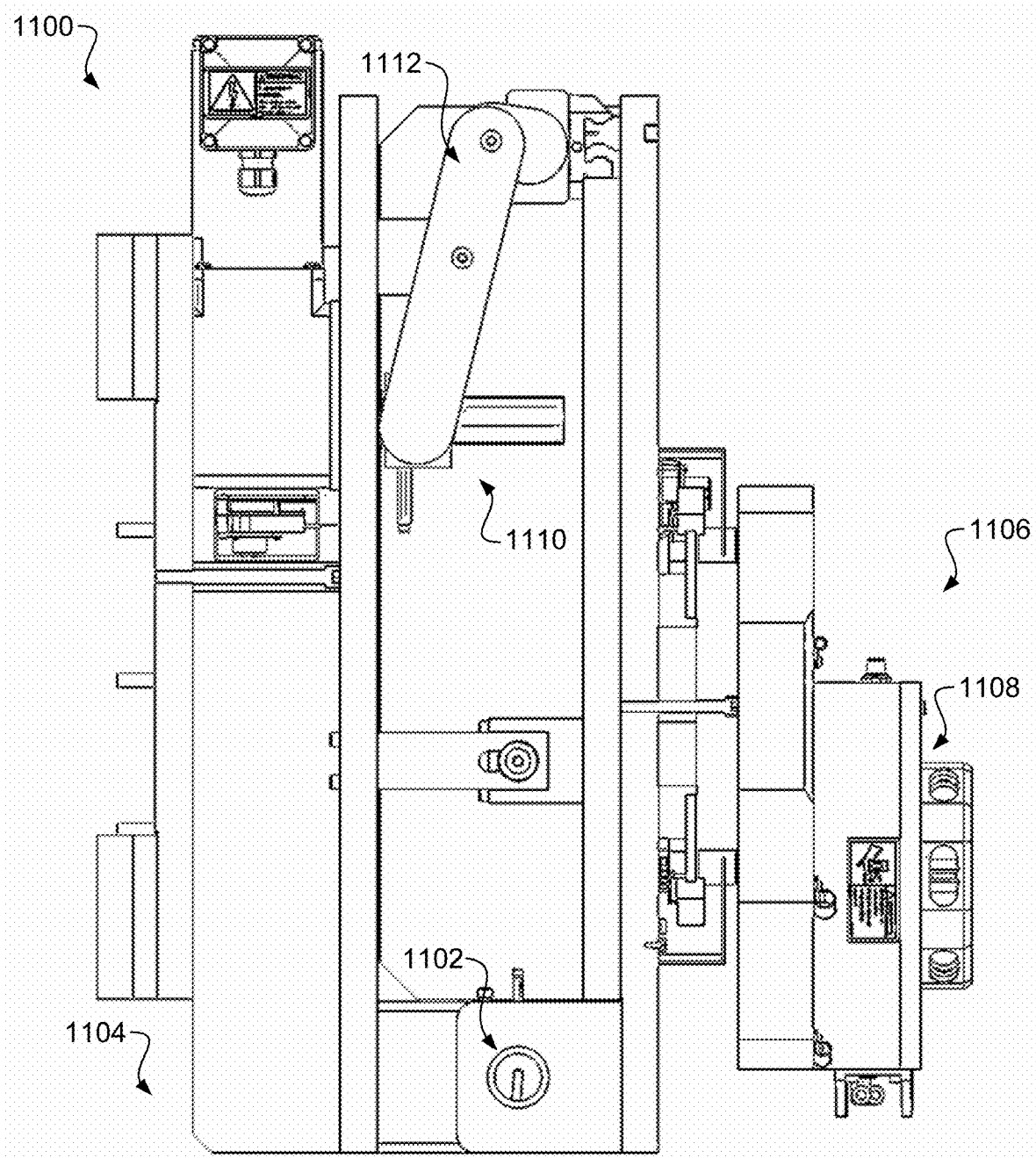
FIG. 11 depicts a side view of an example portion of a weight transfer mechanism in accordance with the present disclosure.

FIG. 11 depicts an example of a weight transfer mechanism or sag compensation system 1100. Due to the weight of the test head, the arms and/or other components of the manipulator may deflect as the test head is lifted. In some cases, the far, unsupported end or distal end of the test head may sag (be lowered than the near, connected side of the test head) as the test head is lifted. This sagging may cause the test head to be lifted in a non-level orientation. A non-level orientation may pose some risks especially as the test head is lowered back onto the prober. With the far side contacting the prober first, undesirable mechanical stress may be loaded to the prober, the tower, and the test head itself In some cases, the test head includes sensitive testing equipment and the mechanical stress may have undesirable effects on the test head's instrumentation and/or the prober's components.

In the illustrated example, the weight transfer mechanism 1100 may include a sag pivot point 1102 at the bottom portion 1104 of the manipulator side of the first quick connect assembly 1106. The sag pivot point 1102 may allow the face 1108 of the manipulator side of the first quick connect assembly 1106 to pivot backwards away from the prober. The angle of the manipulator's face may be controlled with a sag motor 1110 and a sag assembly or sag adjustment mechanism 1112. Sensors may be incorporated into the manipulator that determine the level of the test head as the test head is lifted off of the prober. As the weight of the test head imposes a load on the top portion of the manipulator side's face 1108, the sag motor 1110 may readjust the face's angle. As the load increases, the face angle may be adjusted more.

The sag motor 1110 may be instructed to change the angle of the face 1108 in any appropriate manner. In some cases, the sag motor 1110 receives instructions to change the angle based on a height of the test head from off of the prober's top. In other examples, strain gauges communicate the amount of strain on the top portion of the quick connect assembly, an amount of strain at the bottom portion of the quick connect assembly, an amount of strain at another location, or combinations thereof. In yet another example, the test head may have a level sensor that is in communication with the sag motor 1110. In these types of examples, the communication may be a wireless communication or a hard wired communication.

The weight transfer mechanism 1100 may automatically adjust for the weight based on input from sensors. The sag assembly 1112 may move to control the angle of the face 1108. The sag adjustment mechanism may cause the face 1108 to be moved in any appropriate direction to achieve the desired lift of the test head. For example, the face 1108 may be moved in a lateral direction, an in-out direction, a rotary direction, an angular direction, a vertical direction, another type of direction, or combinations thereof.

While the sag motor 1110, the sag assembly 1112, the sag pivot point 1102, and other components involved with orienting the face 1108 of the first quick connect assembly 1106 are depicted in a specific arrangement in the illustrated example, any appropriate arrangement of these components may be used in accordance with the principles described herein. For example, the sag pivot point 1102 may be located at the top of the assembly, the bottom of the assembly, in the middle region of the assembly, another location on the assembly, or combinations thereof. Further, the top portion of the assembly may pivot backwards from the test head to accommodate for the sag, the bottom portion may pivot forward towards the test head to accommodate for the sag, or combinations thereof. In some cases, multiple motors may be used to change the orientation angle of the face 1108.

In the illustrated example, the sag assembly 1112 includes a pivot arm that is connected to the sag motor 1110 on a first end and connected to a linkage to the face 1108 on the other end. As the sag motor 1110 rotates the first end, the second end of the pivot arm travels away from the test head. In those situations where the test head is firmly connected to the first quick connect assembly, the test head moves with the face 1108. In other examples, the face 1108 may be oriented with other types of orientation adjustments. For example, the sag adjustment system may include screw motors, linear actuators, magnetic components, hydraulic components, pneumatic components, other types of components, or combinations thereof.

Maintaining the positional relationships of the test head and peripherals may include transferring the test head weight from the prober to the manipulator and back in a timely manner while keeping the test head aligned or substantially parallel to the top deck of the prober and centered horizontally with the center of the test head. Maintaining these positional relationships can prevent damage the prober/test equipment when moving the test head.

Maintaining the positional relationships of the test head and peripherals can be achieved using a combination of in-out directions, vertical directions, tilted orientations, twisting directions, or combinations thereof. In some examples, the manipulator may be constructed with a sag adjustment that has a pivot point toward the bottom of the test head and the face can be motorized to move in the in-out and vertical directions. In some cases, the test head is lifted off the prober in only the vertical direction. In other examples, to prevent deflection of the manipulator components in the horizontal direction, which may put substantial loads on the alignment pins and other components, the face may move in the in-out direction as well as in the vertical movement. The combination of these movements has been shown to compensate for the horizontal deflection.

In another example, the sag adjustment is motorized and the pivot point is located toward the bottom of the test head as depicted in the illustrated examples. Motorizing the sag adjustment, along with adding a positional sensor, may enable the test head weight transfer to be fully automated. The automation may substantially reduce the horizontal loading on the alignment components. Moving the pivot point may decrease the distance that the interface portion of the test head translates horizontally during sag adjustment. In some cases, the sag pivot point is located close or at the same horizontal plane as the interface portion of the test head.

Figure 12:
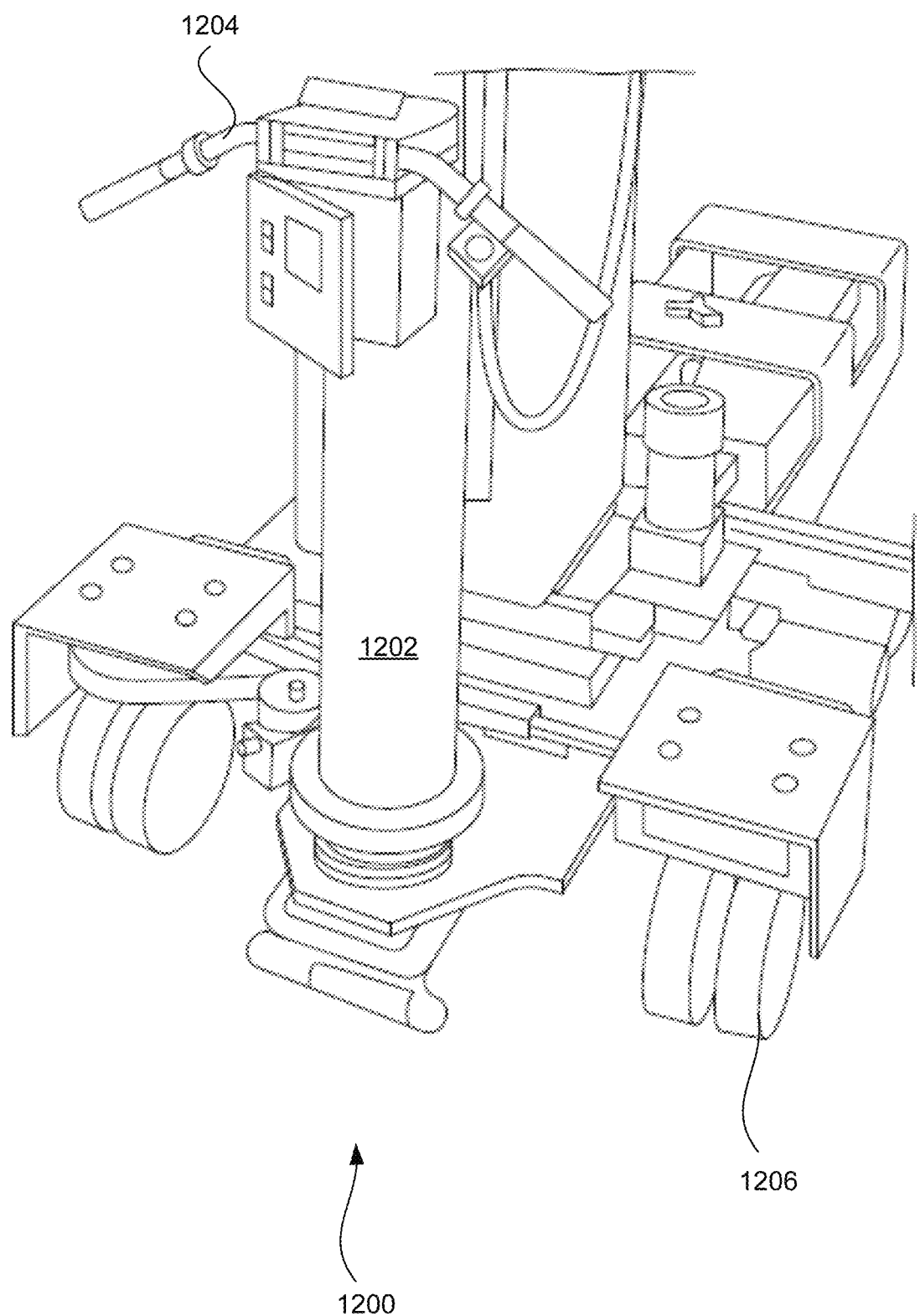
FIG. 12 depicts a perspective view of an example of steerable caster incorporated into a base portion of a manipulator in accordance with the present disclosure.

FIG. 12 depicts an example of a steerable caster 1200 incorporated into a manipulator. A steering column 1202 may connect a steering handle 1204 to the steerable caster 1206. In some examples, the user may push the manipulator forward or backward as desired while steering the steerable caster 1206 with the steering handle 1204. In this example, two steerable casters 1206 control the angle of the manipulator's trajectory. Slave casters, which are located in the front of the base portion and are not clearly visible in the illustrated example, may follow the direction of the steerable casters 1206. In some examples, the slave casters are non-swivel casters. In other examples, at least some of the slave casters are swivel casters.

In some circumstances, it may be desirable to keep the forces generated by moving the manipulator low so that the manipulator is easy to move and that the forces do not disturb the other test cells. Lowering the force may be achieved with a caster system that is steerable by the operator to orient the casters in the desired movement direction. These forces can be reduced even more by adding a motorized caster system. The motorized drive caster may be battery operated so that it is not tethered during use to a cord or to an external power source. In some cases, it may be desirable to have the manipulator plugged in when servicing the test head. Having the manipulator plugged in while servicing the test head may allow for the battery to charge or to power a device that is used during servicing such as a light, a cooling system, a tool, another type of device, or combinations thereof.

In some examples, the steerable caster is controlled remotely through a wireless device. In this example, the manipulator may or may not include a steerable handle. In some cases, one or more of the slave casters are in communication with a motor that rotates the slave caster in a desired direction. In this example, the motor is independent of the steerable caster.

While the examples above have been described with two steerable casters, any appropriate number of casters may be used in accordance with the principles described herein. Further, any appropriate number of slave casters may be used in accordance with the principles described herein.

The manipulator may be controlled through any appropriate control system. In some cases, the manipulator is controlled with a digital device. The digital device may include a screen that depicts images. The digital device may be a remote device, a mobile device, an electronic tablet, a laptop, a desktop, a networked device, a cloud-based device, a computing device, another type of device, or combinations thereof. The digital device may include buttons presented in its display screen that may be selected through a touch input. In other examples, the buttons are selected through the use of a cursor. In yet other examples, the buttons are selected through verbal commands, hand gesture commands, other types of commands, or combinations thereof.

Figure 13:
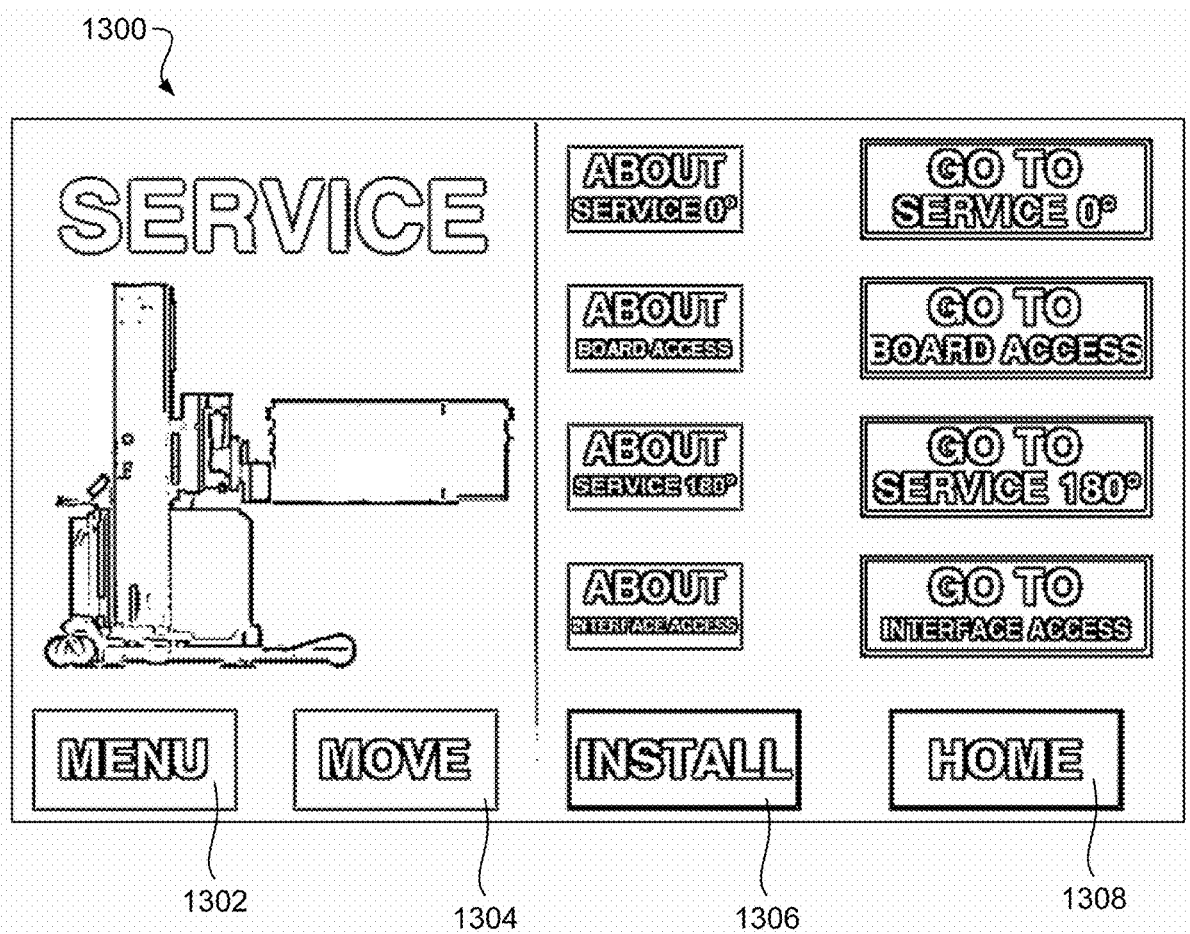
FIG. 13 depicts a front view of an example of a display for controlling a manipulator in accordance with the present disclosure.

FIG. 13 depicts an example of a screen 1300 that may be used to control the manipulator. In this example, the screen 1300 may be a touch screen, or a cursor may be used to select buttons on the screen 1300. In this example, the user may select a menu button 1302 to select options for controlling the manipulator, view information about the manipulator, get a reading on measurements, location, or other data on the operations of the manipulator, handle other types of activities with the manipulator, or combinations thereof. A move button 1304 may be used to control to where and how the manipulator moves. An install button 1306 may direct the user to access setup features for the initial install and adjustment of the manipulator to the prober and test head or other peripherals. A home button 1308 may be used to take the user back to a home screen.

FIG. 13 Is representative of the Human Machine Interface (HMI) for the Invention. The operator may use the HMI to view or access that status of sensors, positions, operations, etc. For example, the INSTALL button 1306 enables the operator to access functions related to installation of the Test Head. Another example is the MOVE button 1304 which enables the operator to access functions related to single axis motions of the Invention.

Figure 14:
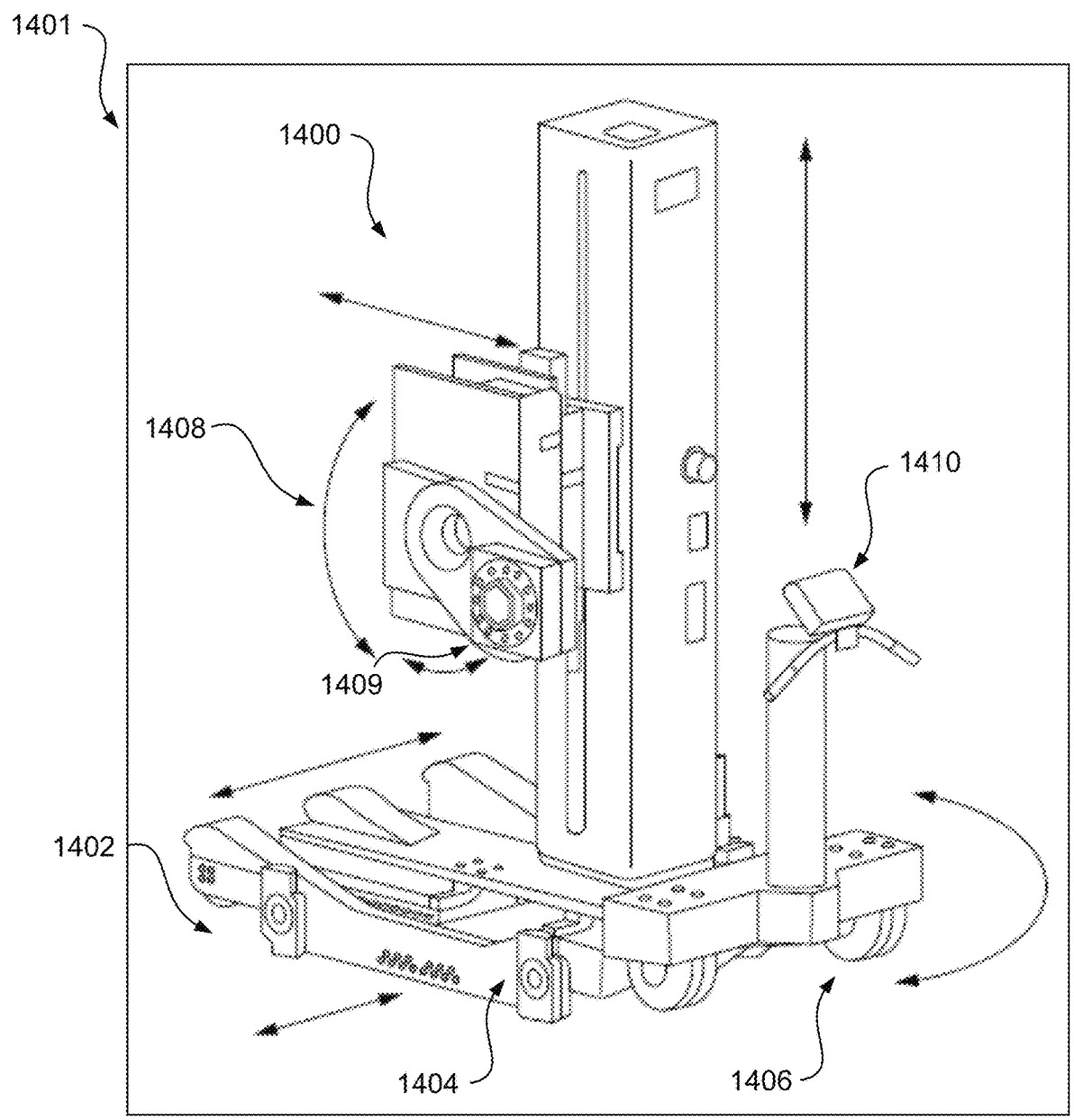
FIG. 14 depicts a perspective view of an example of a display for controlling a manipulator in accordance with the present disclosure.

FIG. 14 depicts an example of a screen 1401 that depicts how the manipulator 1400 can be moved to either interlock with the test head or transport the test head to a desired location. In some examples, the manipulator 1400 lifts the test head off of the prober, moves the test head just to the side of the prober, and hold the test head in place so that a technician can service the test head. In this example, the manipulator 1400 may not move out of the test cell before returning the test head to the prober.

In the illustrated example of FIG. 14, the user may control the movement of the outrigger 1402 using the display screen. In some cases, the user may slide the outrigger 1402 in the screen 1401 with a finger input to cause the outrigger to slide in and out along a track of the manipulator. A plurality of second quick connect assemblies 1404 are depicted on the outrigger 1402, which can connect to the prober to provide stability as the manipulator 1400 lifts the test head, moves the test head, holds the test head off of the ground, or combinations thereof. In some cases, the user may control these quick connect assemblies through the screen 1401. The outrigger 1402 may move outward to connect to the prober, and the outrigger 1402 may move inward when disconnecting from the prober.

The casters 1406 may rotate the entire manipulator 1400 or move the manipulator 1400 towards and/or away from the prober. In some cases where the outrigger is broken or not incorporated into the manipulator 1400, the casters 1406 may position the quick connection assemblies 1404 for connection with the prober.

A connection unit 1408 may include the first quick connect assembly 1409 for connecting to the test head. The connection unit 1408 may move vertically along a track incorporated into the upright portion 1410 of the manipulator 1400. The connection unit 1408 may also be able to twist about a rotational axis to assist with aligning the first quick connect assembly with the test head. Additionally, the orientation angle of the connection unit 1408 may be able to tilt forward and/or backward to accommodate for the sag induced into the system from the weight of the test head.

Figure 15:
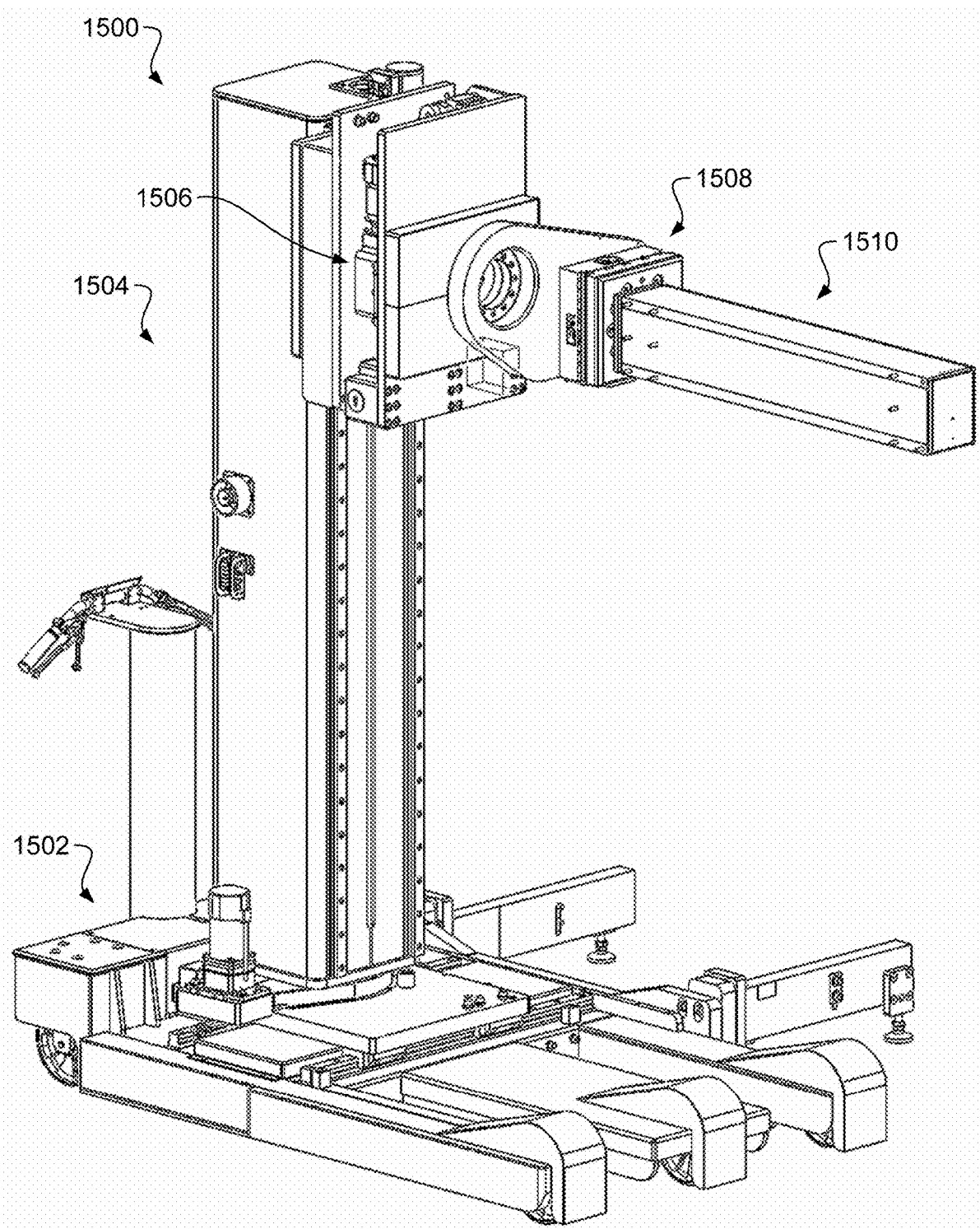
FIG. 15 depicts a perspective view of an example of a manipulator in accordance with the present disclosure.

FIG. 15 depicts an example of a manipulator 1500. In this example, the manipulator 1500 has a base portion 1502 and an upright portion 1504 connected to the base portion 1502. A connection unit 1506 may be connected to the upright portion 1504 in such a manner that the connection unit 1506 may travel along a length of the upright portion 1504. In some cases, the connection unit 1506 may swivel with respect to the upright portion 1504. The connection unit 1506 may include the first quick connect assembly 1508 for connecting to the test head. Additional, the orientation angle of the connection unit 1408 may be able to tilt forward and/or backward to accommodate for the sag induced into the system from the weight of the test head through components that are incorporated into the connection unit 1506.

In the illustrated example, the first quick connect assembly 1508 is depicted as being connected to a test head arm 1510. The test head arm 1510 may be connected to the test head, interlocked with the test head, or otherwise configured to support the weight of the test head. Thus, when the first quick connect assembly 1508 is interlocked with the test head arm 1510, the test head moves with the movements of the connection unit 1506. Thus, if the connection unit 1506 travels along the length of the upright portion 1504, the test head also moves along the length of the upright portion 1504. Additionally, if the connection unit 1506 pivots with the upright portion 1504, the test head also pivots with the upright portion 1504. Further, when the connection unit 1506 swivels with respect to the upright portion 1504, the test head swivels with respect to the upright portion 1504.

Figure 16:
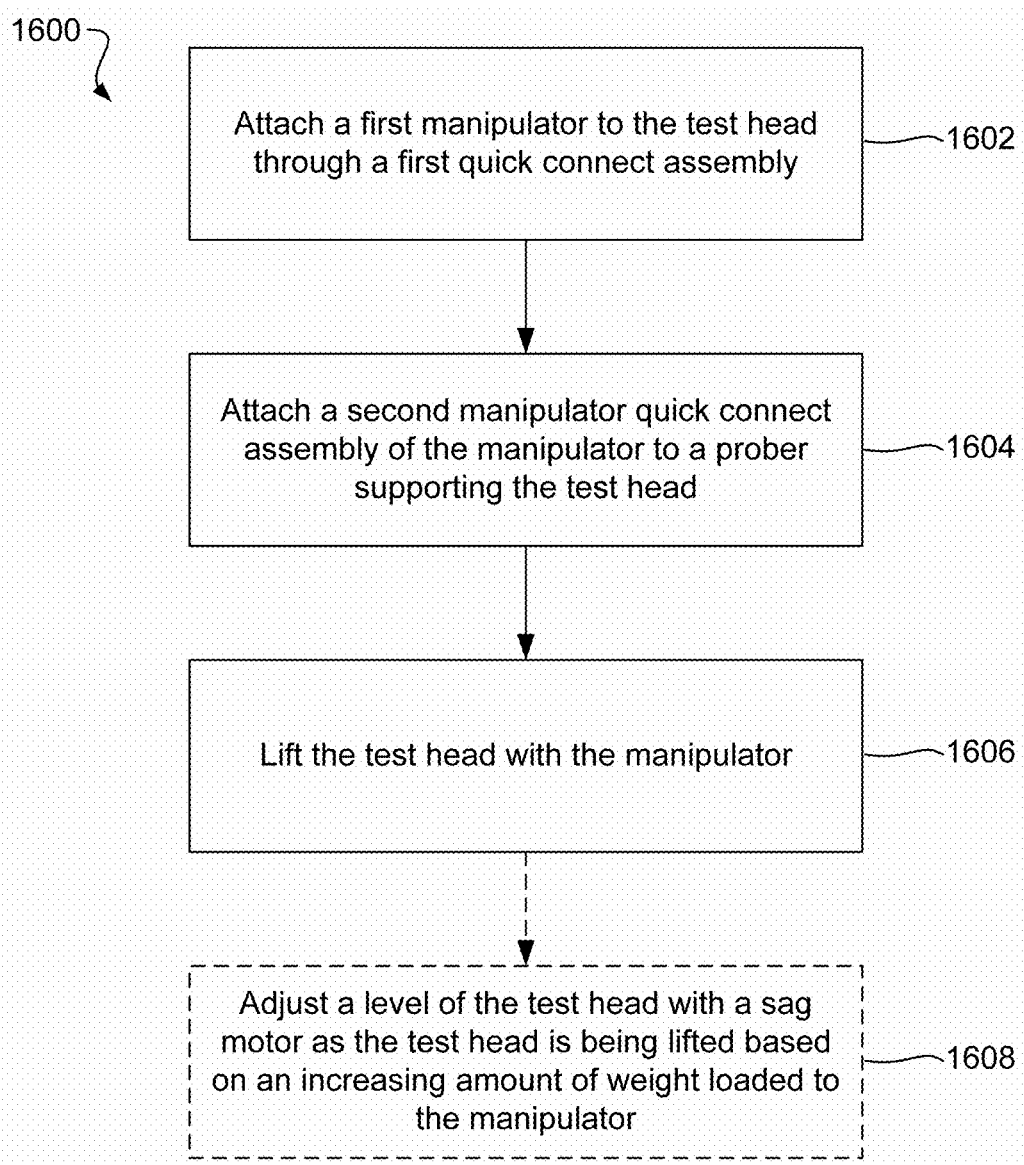
FIG. 16 depicts a method of an example of moving a test head in accordance with the present disclosure.

FIG. 16 depicts an example of a method 1600 of moving a test head. In this example, the method 1600 includes attaching 1602 a first manipulator to the test head through a first quick connect assembly, attaching 1604 a second manipulator quick connect assembly of the manipulator to a prober supporting the test head, and lifting 1606 the test head with the manipulator. In some cases, the method 1600 may include adjusting 1606 a level of the test head with a sag motor as the test head is being lifted based on an increasing amount of weight loaded to the manipulator.

In some examples, the method may also include independently moving the second quick assembly connect into a position to connect to a base of the manipulator to the prober. Moving the second quick connect assembly may include moving the second quick connect assembly on an outrigger connected to the base of the manipulator. In other examples, the second quick connect may be moved by a screw motor, a linear actuator, a pivoting mechanism, another type of mechanism, or combinations thereof.

The first quick connect assembly may complete a connection by inserting a protrusion of the first quick connect assembly into a receptacle of the test head. When the protrusion is inserted into the receptacle, an locking element of the protrusion may expand away from a central axis of the protrusion to interlock with the receptacle. With the locking element expanded, the locking element may interlock with features incorporated into the surface of the receptacle thereby interlocking the protrusion to the receptacle and thereby interlocking the manipulator to the test head.

With the first and second quick connection assemblies interlocked, the manipulator may lift the test head off of the prober. Due to the weight of the test head, the mechanical strain may be transferred to the manipulator as the test head is lifted. This may cause portions of the manipulator to sag under the weight of the test head. For example, in those cases where the first quick connect is supported by a manipulator arm, the manipulator arm may sag under the weight of the test head. At least one sensor may be incorporated into the manipulator arm or another portion of the manipulator to measure the mechanical strain. This sensor may be a strain gauge. In other examples, the strain is measured by measuring the angle of the face of the first quick connect assembly or the angle of another feature of the manipulator that is affected by the mechanism strain imposed by the test head.

The manipulator arm or another feature of the manipulator may be oriented to counteract the negative effects of the mechanical strain. This may include using a sag motor to rotate a portion of the manipulator arm to buttress the arm due to the mechanism strain. In some cases, another mechanism is used to orient the test head to a desired orientation. But, an advantage of orientating the test head based on the level of strain imposed by the test head's weight is a level orientation of the test head. With the test head at a level orientation, the test head may be lifted off of the prober's surface or another type of surface so that the near side and the far side of the test head are lifted off of the prober at substantially the same time. This may prevent a substantial amount of the test head's weight from being unequally loaded to just a portion of the test head and thereby prevent damage to the test head. Further, by orienting the test head so that the test head is level with the surface onto which the head is being lowered, the manipulator can avoid the test head unequally loading a substantial amount of weight to the just a portion of the test head.

While the examples above have been described with reference to the test head attached to the manipulator while the manipulator is positioned on the prober, the manipulator may be used to move the test head for any appropriate purpose. For example, the manipulator may be used to remove the test head from a crate, attach an arm to the test head, place the tower interface into a prober, lift the test head off the floor, service the test head, perform another function, or combinations thereof.

Illustrative Implementations

P1. A manipulator, comprising: a base portion; an upright portion connected to the base portion; a test head attachment incorporated into the upright portion; and a first quick connect assembly incorporated into the test head attachment.

P2. The manipulator of paragraph P1, further including: a second quick connect assembly incorporated into the base portion.

P3. The manipulator of paragraph P2, wherein the base portion further includes: an extendable outrigger; and the second quick connect assembly is incorporated into the extendable outrigger.

P4. The manipulator of paragraph P1, further including a steerable caster incorporated into the base portion.

P5. The manipulator of paragraph P1, further including a weight transfer mechanism.

P6. The manipulator of paragraph P4, wherein the weight transfer mechanism dynamically adjusts for a weight of a test head when the manipulator is connected to the test head and the manipulator lifts or places the test head on or off of a weight bearing structure.

P7. The manipulator of paragraph P6, wherein the weight bearing structure is a prober.

P8. The manipulator of paragraph P5, wherein the weight transfer mechanism further includes: a manipulator face configured to connect to a test head; and a sag motor that controls an angle of the manipulator face.

P9. The manipulator of paragraph P5, wherein the weight transfer mechanism includes a level sensor to determine a level of a test head when the test head is connected to the manipulator through the first quick connect assembly.

P10. The manipulator of paragraph P8, wherein the sag motor continuously adjusts a level of the test head as the manipulator moves the test head off of a platform.

P11. The manipulator of paragraph P1, wherein the first quick connect assembly includes: a protrusion; a locking element located within the protrusion; wherein the protrusion is sized to be inserted into a receptacle of a test head attachment and the locking element movable with respect to a central axis of the protrusion to interlock with the receptacle.

P12. A method of moving a test head, comprising: attaching a first quick connect assembly of a manipulator to the test head through a first quick connect assembly; attaching a second quick connect assembly of the manipulator to a prober supporting the test head; and lifting the test head with the manipulator.

P13. The method of paragraph P12, further including: adjusting a level of the test head with a sag motor as the test head is being lifted based on an increasing amount of weight loaded to the manipulator.

P14. The method of paragraph P12, further including: independently moving the second quick connect assembly connect into a position to connect to a base portion of the manipulator to the prober.

P15. The method of paragraph P14, wherein moving the second quick connect assembly includes moving the second quick connect assembly on an outrigger connected to the base portion of the manipulator.

P16. The method of paragraph P14, further including: inserting a protrusion of the second quick connect assembly into a receptacle of the test head; movmg lockable element of the protrusion with respect to a central axis of the protrusion to interlock with the receptacle.

P17. The method of paragraph P12, further includes continuously measuring a level of the test head while lifting the test head.

P18. The method of paragraph P12, wherein attaching the second quick connect assembly of the manipulator to the prober occurs before attaching the first quick connect assembly to the test head through the first quick connect assembly.

P19. A manipulator, comprising: a base portion; an upright portion connected to the base portion; a first quick connect assembly incorporated into the upright portion; an outrigger connected to the base portion; and a second quick connect assembly attached to the outrigger.

P20. The manipulator of paragraph P19, further including: a weight transfer mechanism incorporated into the manipulator, the weight transfer mechanism including: a sag motor; a level sensor in communication with the sag motor; wherein the weight transfer mechanism dynamically adjusts an angle of a face of the first quick connect assembly when a test head is being lifted in response to outputs from the level sensor.

INCORPORATION BY REFERENCE

The entire content of each document listed below is incorporated by reference into this document (the documents below are collectively referred to as the "incorporated documents").

U.S. Pat. No. 10,634,718 (application Ser. No. 15/728,206), titled "Manipulator for Moving a Test Head," filed on 9 Oct. 2017, issued on 28 Apr. 2020.

U.S. Prov. App. No. 62/406,235, titled "Mobile Manipulator," filed on 10 Oct. 2016.

The invention claimed is:

1. A manipulator comprising:
a base portion;
an upright portion coupled to the base portion; and
a sag compensation system coupled to or part of the upright portion, the sag compensation system including one or more sensors;
wherein the manipulator is configured to lift a test head that is part of an automatic test equipment system; and
wherein the sag compensation system is configured to automatically compensate for horizontal deflection using input from the one or more sensors, the horizontal deflection being caused by shifting the weight of the test head to the manipulator as the test head is lifted.

2. The manipulator of claim 1 wherein the sag compensation system is configured to compensate for sagging of a distal end of the test head as the test head is lifted.

3. The manipulator of claim 1 wherein the sag compensation system is configured to maintain the test head level as the test head is lifted.

4. The manipulator of claim 1 wherein the one or more sensors include a level sensor configured to measure horizontal deflection of the test head as it is lifted, and wherein the sag compensation system is configured to receive information about the measured horizontal deflection from the level sensor and use the information to maintain the test head level as the test head is lifted.

5. The manipulator of claim 1 comprising:
a sag adjustment mechanism coupled to or part of the upright portion; and
a connection assembly coupled to the upright portion by way of the sag adjustment mechanism, the connection assembly being configured to be coupled to the test head;
wherein the sag adjustment mechanism is configured to tilt the connection assembly to automatically compensate for the horizontal deflection caused by shifting the weight of the test head to the manipulator as the test head is lifted.

6. The manipulator of claim 5 comprising a sag motor configured to drive movement of the sag adjustment mechanism.

7. The manipulator of claim 5 wherein the sag adjustment mechanism is configured to pivot a top portion of the connection assembly backwards away from the test head to automatically compensate for the horizontal deflection caused by shifting the weight of the test head to the manipulator as the test head is lifted.

8. The manipulator of claim 1 comprising a quick connect assembly coupled to or part of the upright portion, wherein the quick connect assembly is configured to be coupled to the test head without the use of tools or fasteners.

9. The manipulator of claim 8 comprising a locking element configured to lock the quick connect assembly to the test head.

10. The manipulator of claim 8 wherein the quick connect assembly is a first quick connect assembly, the manipulator comprising a second quick connect assembly coupled to or part of the upright portion, the second quick connect assembly being configured to be coupled to a wafer prober without the use of tools or fasteners.

11. The manipulator of claim 10 wherein the second quick connect assembly is coupled to an extendable outrigger.

12. A method comprising:
lifting a test head off a weight bearing structure with a manipulator, the test head being part of an automatic test equipment system; and
automatically adjusting for horizontal deflection using input from one or more sensors, the horizontal deflection being caused by the weight of the test head shifting to the manipulator as the test head is lifted off the weight bearing structure.

13. The method of claim 12 comprising:
lowering the test head onto the weight bearing structure with the manipulator; and
automatically adjusting for horizontal deflection caused by the weight of the test head shifting to the weight bearing structure as the test head is lowered onto the weight bearing structure.

14. The method of claim 12 wherein automatically adjusting for the horizontal deflection includes adjusting for sagging of a distal end of the test head as the test head is lifted.

15. The method of claim 12 wherein automatically adjusting for the horizontal deflection includes maintaining the test head level as the test head is lifted.

16. The method of claim 15 wherein automatically adjusting for the horizontal deflection includes measuring horizontal deflection of the test head with a level sensor and using information about the measured horizontal deflection from the level sensor to maintain the test head level as the test head is lifted.

17. The method of claim 12 wherein automatically adjusting for the horizontal deflection includes tilting a connection assembly that is part of the manipulator and is coupled to the test head.

18. The method of claim 12 wherein the weight bearing structure is a wafer prober.

19. The method of claim 12 comprising coupling the manipulator to the test head without the use of tools or fasteners.

20. The method of claim 12 comprising coupling a base of the manipulator to the weight bearing structure.

21. A manipulator comprising:
a base portion;
an upright portion coupled to the base portion; and
a sag compensation system coupled to or part of the upright portion, the sag compensation system including a level sensor;
wherein the manipulator is configured to lift a test head that is part of an automatic test equipment system;
wherein the sag compensation system is configured to compensate for horizontal deflection caused by shifting the weight of the test head to the manipulator as the test head is lifted;
wherein the level sensor is configured to measure horizontal deflection of the test head as it is lifted; and
wherein the sag compensation system is configured to receive information about the measured horizontal deflection from the level sensor and use the information to maintain the test head level as the test head is lifted.

* * * * *